(12) United States Patent
Kobayashi et al.

(10) Patent No.: US 9,627,309 B2
(45) Date of Patent: Apr. 18, 2017

(54) WIRING SUBSTRATE

(71) Applicant: Shinko Electric Industries Co., Ltd., Nagano-shi, Nagano-ken (JP)

(72) Inventors: Kazuhiro Kobayashi, Nagano (JP); Junji Sato, Nagano (JP); Yasuhiko Kusama, Nagano (JP)

(73) Assignee: Shinko Electric Industries Co., Ltd., Nagano-shi, Nagano-ken (JP)

( * ) Notice: Subject to any disclaimer, the term of this patent is extended or adjusted under 35 U.S.C. 154(b) by 0 days.

(21) Appl. No.: 15/138,469

(22) Filed: Apr. 26, 2016

(65) Prior Publication Data

US 2016/0322295 A1    Nov. 3, 2016

(30) Foreign Application Priority Data

Apr. 28, 2015  (JP) ................................. 2015-091513

(51) Int. Cl.
| | |
|---|---|
| *H01L 23/48* | (2006.01) |
| *H01L 23/498* | (2006.01) |
| *H01L 23/00* | (2006.01) |
| *H01L 25/065* | (2006.01) |
| *H01L 23/538* | (2006.01) |

(52) U.S. Cl.
CPC .. *H01L 23/49838* (2013.01); *H01L 23/49816* (2013.01); *H01L 23/49822* (2013.01); *H01L 23/49827* (2013.01); *H01L 23/5385* (2013.01); *H01L 23/5389* (2013.01); *H01L 24/46* (2013.01); *H01L 25/0652* (2013.01); *H01L 2224/48091* (2013.01); *H01L 2225/0652* (2013.01); *H01L 2924/00014* (2013.01)

(58) Field of Classification Search
CPC ........... H01L 23/53238; H01L 23/5222; H01L 23/53295; H01L 21/7682; H01L 21/768
See application file for complete search history.

(56) References Cited

U.S. PATENT DOCUMENTS

2015/0043183 A1*  2/2015  Ishiguro ................. H05K 1/185
                                                                    361/761

FOREIGN PATENT DOCUMENTS

| | | |
|---|---|---|
| JP | 2009-200389 | 9/2009 |
| JP | 2012-191204 | 10/2012 |

\* cited by examiner

*Primary Examiner* — (Vikki) Hoa B Trinh
(74) *Attorney, Agent, or Firm* — Fish & Richardson P.C.

(57) ABSTRACT

A wiring substrate includes a first wiring substrate, a first insulation layer stacked on the first wiring layer, and second and third insulation layers sequentially stacked on the first insulation layer. An electronic component is mounted on the first insulation layer in a cavity extending through the second and third insulation layers. The cavity is filled with a fourth insulation layer that entirely covers an upper surface of the third insulation layer and covers the electronic component. A second wiring layer is incorporated in the second and third insulation layers and electrically connected to the first wiring layer. The second wiring layer is electrically connected to a third wiring layer, which is stacked on the fourth insulation layer, by a first via wiring extending through the second and third insulation layers.

8 Claims, 18 Drawing Sheets

WIRING SUBSTRATE

CROSS-REFERENCE TO RELATED APPLICATIONS

This application is based upon and claims the benefit of priority from prior Japanese Patent Application No. 2015-091513, filed on Apr. 28, 2015, the entire contents of which are incorporated herein by reference.

FIELD

This disclosure relates to a wiring substrate and a method for manufacturing a wiring substrate.

BACKGROUND

Japanese Laid-Open Patent Publication Nos. 2009-200389 and 2012-191204 describe a wiring substrate that incorporates an electronic component such as a chip capacitor. One example of such a wiring substrate will now be described.

As illustrated in FIG. 23, a wiring substrate 200 has a structure obtained by sequentially stacking a wiring layer 201, an insulation layer 202, a wiring layer 203, an insulation layer 204, a wiring layer 205, an insulation layer 206, and a wiring layer 207.

The insulation layer 202 covers the upper surface and the side surfaces of the wiring layer 201 and exposes the lower surface of the wiring layer 201. The wiring layer 203 and a metal layer 208 are formed on the upper surface of the insulation layer 202. Via wirings extending through the insulation layer 202 electrically connect the wiring layer 203 to the wiring layer 201. The insulation layer 204 is on the upper surface of the insulation layer 202 and covers the wiring layer 203. Through holes VH10 extend through the insulation layer 204 in the thickness-wise direction and partially expose the upper surface of the wiring layer 203. In the same manner, an opening 204X extends through the insulation layer 204 in the thickness-wise direction and partially exposes the upper surface of the metal layer 208. The wiring layer 205 is formed on the upper surface of the insulation layer 204. The through holes VH10 are filled with via wirings that electrically connect the wiring layer 205 to the wiring layer 203. An electronic component 209 is mounted on the exposed upper surface of the metal layer 208 in the opening 204X. The opening 204X is filled with the insulation layer 206, which covers the surface of the wiring layer 205 and the surfaces of the electronic component 209. The wiring layer 207 is formed on the upper surface of the insulation layer 206. Via wirings extend through the insulation layer 206 and electrically connect the wiring layer 207 to the wiring layer 205 or the electronic component 209. The wiring substrate 200 may be manufactured as described below.

First, the wiring layer 201 is formed on a support substrate. Then, the insulation layer 202 is formed covering the wiring layer 201. The wiring layer 203 and the metal layer 208 are stacked on the insulation layer 202. Then, the insulation layer 204 is formed. The insulation layer 204 undergoes laser processing that forms the through holes VH10. The wiring layer 205 is formed on the upper surface of the insulation layer 204. The insulation layer 204 also undergoes laser processing that forms the opening 204X. The electronic component 209 is mounted on the metal layer 208 in the cavity defined by the opening 204X, which is filled with the insulation layer 206 that entirely covers the electronic component 209. Then, the wiring layer 207 is formed on the upper surface of the insulation layer 206. Finally, the support substrate is removed.

As described above, in the wiring substrate 200, the opening 204X is formed on the insulation layer 204, which is a single layer. Further, the opening 204X defines the cavity that accommodates the electronic component 209. Thus, the insulation layer 204 is set to have substantially the same thickness as the electronic component 209 incorporated in the wiring substrate 200. In this configuration, an increase in the thickness of the electronic component 209 increases the thickness of the insulation layer 204. This decreases the diameter at the bottom of each through hole VH10 that is formed through laser-processing. As a result, the connection reliability may be decreased between the wiring layers 203 and 205, which are electrically connected to each other by the via wirings in the through holes VH10.

SUMMARY

One aspect of a wiring substrate includes a first wiring layer, a first insulation layer stacked on the first wiring layer, and a plurality of insulation layers including a second insulation layer, which is stacked on an upper surface of the first insulation layer, and a third insulation layer, which is stacked on an upper surface of the second insulation layer. A cavity extends through the plurality of insulation layers and partially exposes the upper surface of the first insulation layer. An electronic component is mounted on the first insulation layer exposed in the cavity. A fourth insulation layer entirely covers an upper surface of an uppermost one of the plurality of insulation layers and covers the electronic component. The cavity is filled with the fourth insulation layer. A second wiring layer is electrically connected to the first wiring layer, incorporated in the plurality of insulation layers, and covered by the uppermost one of the plurality of insulation layers. A first via wiring extends through the uppermost one of the plurality of insulation layers and the fourth insulation layer. A third wiring layer is stacked on an upper surface of the fourth insulation layer and electrically connected to the second wiring layer by the first via wiring.

Other aspects and advantages of the embodiments will become apparent from the following description, taken in conjunction with the accompanying drawings, illustrating by way of example the principles of the invention.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which:

FIGS. 4A to 4D, 5A to 5D, 6A to 6D, 7A to 7E, 8A to 8D, 9A, and 9B are schematic cross-sectional views illustrating a method for manufacturing the wiring substrate of FIG. 1A, in which FIG. 6C is a partially enlarged cross-sectional view of FIG. 6B, and FIGS. 7D and 7E are partially enlarged cross-sectional views of FIG. 7C;

FIGS. 11A, 11B, and 12A to 12D are schematic cross-sectional views illustrating a method for manufacturing the wiring substrate of FIG. 10A, in which FIG. 12C is a partially enlarged cross-sectional view of FIG. 12B;

DESCRIPTION OF THE EMBODIMENTS

Figure 1A:
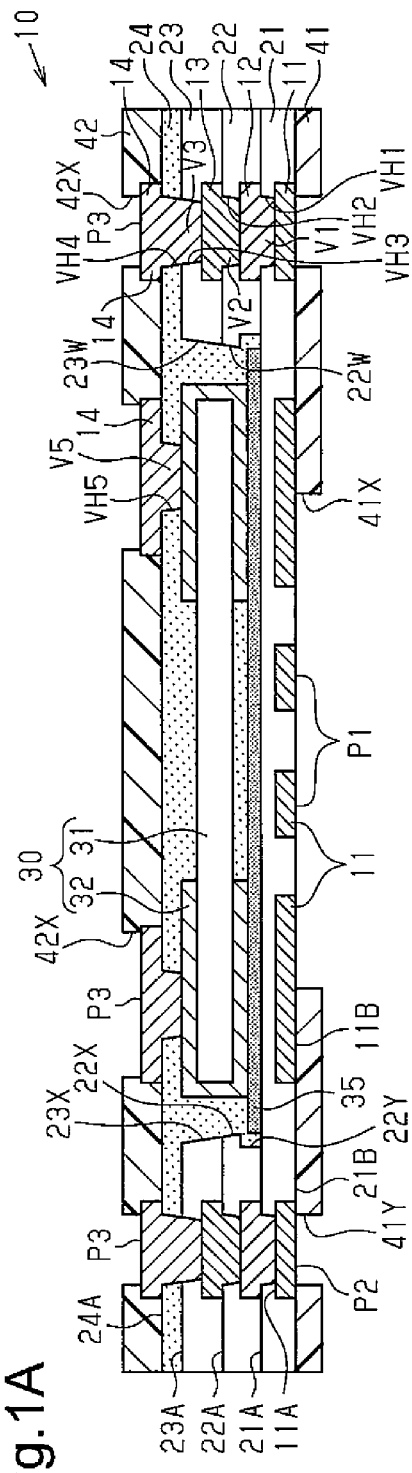
FIG. 1A is a schematic cross-sectional view illustrating a first embodiment of a wiring substrate taken along line 1-1 in FIG. 2.

Embodiments will now be described with reference to the drawings. In the drawings, elements are illustrated for simplicity and clarity and have not necessarily been drawn to scale. To facilitate understanding, hatching lines may not be illustrated or be replaced by shadings in the cross-sectional drawings.

First Embodiment

A first embodiment will new be described with reference to FIGS. 1A to 9C. As illustrated in FIG. 1A, a wiring substrate 10 has a structure obtained by sequentially stacking a wiring layer ii, an insulation layer 21, a wiring layer 12, an insulation layer 22, a wiring layer 13, an insulation layer 23, an insulation layer 24, and a wiring layer 14. In the first embodiment, the wiring substrate 10 is a coreless wiring substrate that does not include a core substrate serving as a support substrate. The coreless wiring substrate differs from a wiring substrate formed by sequentially stacking a given number of build-up layers on one surface or both surfaces of a core substrate (support substrate) by employing a typical build-up process.

The wiring substrate 10 includes at least one (in this case, one) chip capacitor 30 incorporated in the insulation layers 21 to 24, a solder resist layer 41 stacked on the lower surface 21B of the insulation layer 21, and a solder resist layer 42 stacked on the upper surface 24A of the insulation layer 24.

The wiring layers 11 to 14 may be formed from, for example, copper (Cu) or a copper alloy. The material of the insulation layers 21 to 24 may be, for example, an insulative resin, such as an epoxy resin or a polyimide resin, or a resin material obtained by mixing such resins with a filler, such as silica or alumina. The insulation layers 21 to 24 may be formed from, for example, an insulative resin containing a reinforcement material. The insulative resin is obtained by impregnating a reinforcement material, such as a woven cloth or non-woven cloth of glass, aramid, or liquid crystal polymer (LCP) fibers, with a thermosetting resin, of which the main component is epoxy resin, polyimide resin, or the like. The material of the insulation layers 21 to 24 may be a thermosetting resin or a photosensitive resin.

The wiring layer 11 is the outermost wiring layer (here, the lowermost wiring layer) of the wiring substrate 10. The wiring layer 11 includes an upper surface 11A, a lower surface 11B, and side surfaces. In the present example, the lower surface 11B of the wiring layer 11 is substantially flush with the lower surface 21B of the insulation layer 21. However, the lower surface 11B of the wiring layer 11 may be recessed toward the wiring layer 12 from the lower surface 21B of the insulation layer 21.

The wiring layer 11 is, for example, a micro-wiring layer that is finer than the wiring layers 12 to 14. The wiring layer 11 has a line and space (L/S) that may be, for example, approximately 1 μm/1 μm to 5 μm/5 μm. The line and space (L/S) refers to the wiring width and the interval between adjacent wirings. The wiring layer 11 may have a thickness of, for example, approximately 3 to 20 μm.

The insulation layer 21 covers the upper surface 11A and the side surfaces of the wiring layer 11. Further, the insulation layer 21 exposes the lower surface lib of the wiring layer 11. Through holes VH1 extend through the insulation layer 21 in the thickness-wise direction at given locations and partially expose the upper surface 11A of the wiring layer 11. Each through hole VH1 is, for example, tapered so that the diameter decreases, as viewed in FIG. 1A, from the upper side (side closer to wiring layer 12) toward the lower side (side closer to wiring layer 11). For example, the through hole VH1 has the shape of a generally inverted truncated cone in which the diameter of the lower opening end is smaller than that of the upper opening end. The insulation layer 21 has a thickness measured from the upper surface 11A of the wiring layer 11 to the upper surface 21A of the insulation layer 21 that is, for example, approximately 10 to 35 μm.

The wiring layer 12 is stacked on the upper surface 21A of the insulation layer 21. Each through hole VH1 is filled with a via wiring V1 that electrically connects the wiring layer 12 and the wiring layer 11. The wiring layer 12 is, for example, formed integrally with the via wiring V1. The wiring layer 12 has a thickness of, for example, approximately 8 to 25 μm.

The insulation layer 22 is formed on the upper surface 21A of the insulation layer 21 and covers the wiring layer 12. The upper surface 22A of the insulation layer 22 is located at a lower position than the upper surface of the chip capacitor 30 incorporated in the insulation layers 21 to 24. The thickness of the insulation layer 22 measured from the upper surface of the wiring layer 12 to the upper surface 22A of the insulation layer 22 may be, for example, approximately 30 to 60 μm.

Through holes VH2 extend through the insulation layer 22 in the thickness-wise direction at given locations and partially expose the upper surface of the wiring layer 12. The through holes VH2 are, for example, each tapered so that the diameter decreases from the upper side toward the lower side as viewed in FIG. 1A. For example, the through holes VH2 each have the shape of a generally inverted truncated cone in which the diameter of the lower opening end is smaller than that of the upper opening end.

Further, an opening 22X extends through the insulation layer 22 in the thickness-wise direction of the insulation layer 22 at a given location and partially exposes the upper surface 21A of the insulation layer 21. The opening 22X has a size corresponding to the chip capacitor 30 incorporated in the insulation layers 21 to 24. That is, the opening 22X is located at the position where the chip capacitor 30 is mounted. In the first embodiment, the insulation layer 22 includes a stepped inner wall surface 22W. An upper portion of the stepped inner wall surface 22W defines the opening 22X.

Figure 2:
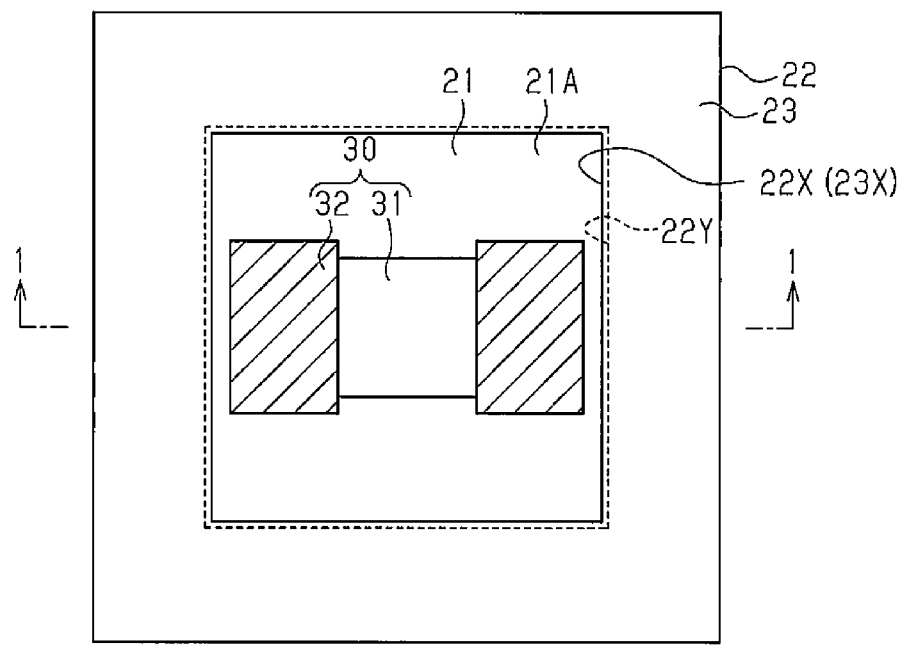
FIG. 2 is a schematic plan view illustrating the wiring substrate of FIG. 1A.

As illustrated in FIG. 2, the opening 22X is tetragonal in a plan view. Further, the opening 22X is larger in size than the chip capacitor 30 in a plan view. For example, the dimensions of the opening 22X may be approximately 0.7 mm×0.4 mm to 15 mm×15 mm in a plan view. FIG. 2 is a schematic plan view illustrating the insulation layers 21 to 23 and the chip capacitor 30 of FIG. 1A.

As illustrated in FIG. 1A, a lower portion of the stepped inner wall surface 22W of the insulation layer 22 defines a recess 22Y. In detail, the lower portion of the stepped inner wall surface 22W is located outward from the upper portion of the stepped inner wall surface 22W to form the recess 22Y. Thus, the recess 22Y is wider than the opening 22X. The lower portion of the stepped inner wall surface 22W, which is continuous with the upper portion of the stepped inner wall surface 22W, contacts the upper surface 21A of the insulation layer 21. Accordingly, the recess 22Y is in communication with the opening 22X. The recess 22Y exposes the lower surface 22B of the insulation layer 22 to the upper side of the insulation layer 21 (refer to FIGS. 1B and 1C) at a middle location between the upper portion and lower portion of the stepped inner wall surface 22W.

As illustrated in FIG. 2, the recess 22Y extends around the entire bottom portion of the opening 22X. However, the recess 22Y may be formed in only part of the bottom portion of the opening 22X. The recess 22Y may have a width of, for example, approximately 20 to 80 µm.

As illustrated in FIG. 1A, the wiring layer 13 is stacked on the upper surface 22A of the insulation layer 22. Each through hole VH2 is filled with a via wiring V2 that electrically connects the wiring layer 13 and the wiring layer 12. The wiring layer 13 is, for example, formed integrally with the via wiring V2. The wiring layer 13 may have a thickness of, for example, approximately 10 to 20 µm.

The insulation layer 23 is formed on the upper surface 22A of the insulation layer 22 and covers the wiring layer 13. The thickness of the insulation layer 23 measured from the upper surface of the wiring layer 13 to the upper surface 23A of the insulation layer 23 may be, for example, approximately 15 to 45 µm.

Through holes VH3 extend through the insulation layer 23 in the thickness-wise direction at given locations and partially expose the upper surface of the wiring layer 13. Further, an opening 23X extends through the insulation layer 23 in the thickness-wise direction at a given location and partially exposes the upper surface 21A of the insulation layer 21. In the same manner as the opening 22X, the opening 23X has a size corresponding to the chip capacitor 30 incorporated in the insulation layers 21 to 24. That is, the opening 23X is located at the position where the chip capacitor 30 is mounted. In the first embodiment, the insulation layer 23 includes an inner wall surface 23W that is continuous with the stepped inner wall surface 22W of the insulation layer 22, and the inner wall surface 23W defines the opening 23X. Accordingly, the opening 23X in the insulation layer 23 and the opening 22X in the insulation layer 22 are in communication with each other and define a single opening region. Thus, as illustrated in FIG. 2, the opening 23X and the opening 22X have the same shape (substantially tetragon) and substantially the same size in a plan view.

The openings 22X and 23X are, for example, each tapered so that the diameter decreases from the upper side toward the lower side as viewed in FIG. 1A. That is, the openings 22X and 23X each have a lower opening end, which is located closer to the upper surface 21A of the insulation layer 21, and an upper opening end, which is located closer to the upper surface 23A of the insulation layer 23. The lower opening end has a smaller width than the upper opening end. The recess 22Y is located below the opening 22X. In the first embodiment, the stepped inner wall surface 22W of the insulation layer 22 defining the opening 22X and the recess 22Y, the inner wall surface 23W of the insulation layer 23 defining the opening 23X, and the upper surface 21A of the insulation layer 21 surrounds a space serving as a cavity that accommodates the chip capacitor 30. The upper surface 21A of the insulation layer 21 defines the bottom surface of the cavity. The two insulation layers 22 and 23 stacked on the insulation layer 21 to serve as cavity formation insulation layers define a stepped cavity contour.

The chip capacitor 30 is mounted on the upper surface 21A of the insulation layer 21 that is exposed in the openings 22X and 23X with the adhesive layer 35 arranged in between. Accordingly, the chip capacitor 30 is arranged in the openings 22X and 23X, that is, the cavity. The adhesive layer 35 is formed on, for example, the same plane as the wiring layer 12. The adhesive layer 35 may be formed from, for example, a thermosetting adhesive of an epoxy, a polyimide, or silicone.

The chip capacitor 30 includes a box-shaped capacitor body 31 and two electrode terminals 32, which are formed on the two longitudinal ends of the capacitor body 31. Each electrode terminal 32 covers the corresponding side surface and portions of the upper and lower surfaces of the corresponding end of the capacitor body 31. The chip capacitor 30 may have a thickness of, for example, approximately 80 to 120 µm. The capacitor body 31, for example, is mainly formed from a ceramic and may include an internal electrode of nickel or copper. The electrode terminals 32 may be formed from, for example, copper or a copper alloy.

In the present example, the upper surface of each electrode terminal 32 of the chip capacitor 30 is flush with the upper surface 23A of the insulation layer 23 or located at a lower position than the upper surface 23A. However, as long as the difference is slight between the upper surface 23A of the insulation layer 23 and the upper surface of each electrode terminal 32 (e.g., one third or smaller of the thickness of the insulation layer 24 measured from the upper surface 23A of the insulation layer 23 to the upper surface 24A of the insulation layer 24), the upper surface 23A of the insulation layer 23 may be located at a lower position than the upper surface of each electrode terminal 32.

The insulation layer 24 is formed on the upper surface 23A of the insulation layer 23. The insulation layer 24 entirely covers the upper surface 23A of the insulation layer 23 and entirely covers the chip capacitor 30. The openings 23X and 22X and the recess 22Y are filled with the insulation layer 24. In the openings 22X and 23X and the recess 22Y, the insulation layer 24 covers the upper surface 21A of the insulation layer 21 that is exposed from the adhesive layer 35, the inner wall surface 23W of the insulation layer 23, and the stepped inner wall surface 22W of the insulation layer 22.

Figure 1B:
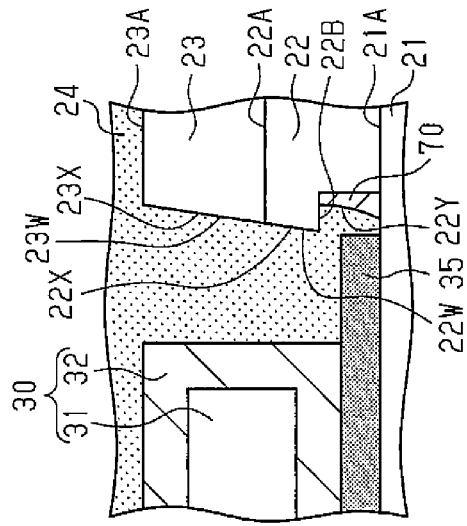
FIGS. 1B and 1C are partially enlarged cross-sectional views of the wiring substrate illustrated in FIG. 1A.

In the embodiment, as illustrated in FIG. 1B, the insulation layer 24 covers the inner wall surface 23W that defines the opening 23X, the upper portion of the stepped inner wall surface 22W that defines the opening 22X, the lower portion of the steeped inner wall surface 22W that defines the recess 22Y, and the lower surface 22B of the insulation layer 22 exposed from the recess 22Y. Accordingly, the insulation layer 24 in the recess 22Y extends into the section below the lower surface 22B of the insulation layer 22.

Figure 1C:
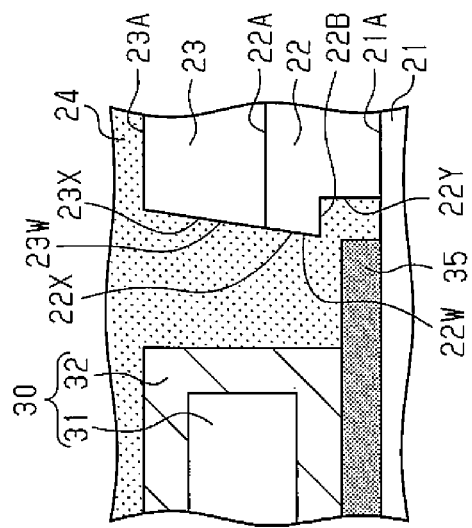

In a further embodiment, as illustrated in FIG. 1C, a metal layer 70 may be formed in part of the recess 22Y at a bounding portion between the insulation layer 22 and the insulation layer 24 (lower portion of stepped inner wall surface 22W). The metal layer 70 is in contact with the insulation layer 22. In this case, the metal layer 70, the lower surface 22B of the insulation layer 22, and the upper surface 21A of the insulation layer 21 surrounds a space that defines a recess 22Y. The recess 22Y is filled with the insulation layer 24 that covers the lower surface 22B of the insulation layer 22, which is exposed in the recess 22Y, and the inner surface of the metal layer 70. In this case, the insulation layer 24 in the recess 22Y also extends into the section below the lower surface 22B of the insulation layer 22.

As illustrated in FIG. 1A, through holes VH4 extend through the insulation layer 24 in the thickness-wise direction at given locations and partially expose the upper surface of the wiring layer 13. The through holes VH4 are in communication with the through holes VH3 of the insulation layer 23. For example, the wall surface of the insulation layer 23 that defines each through hole VH3 is continuous with the wall surface of the insulation layer 24 that defines the corresponding through hole VH4. The through holes VH3 and VH4 are, for example, each tapered so that the diameter decreases from the upper side toward the lower side as viewed in FIG. 1A. In the present example, the through holes VH3 and VH4 each have the shape of a generally inverted truncated cone in which the diameter of the lower opening end is smaller than that of the upper opening end.

Further, through holes VH5 extend through the insulation layer 24 in the thickness-wise direction at given locations and partially expose the upper surface of each electrode terminal 32. The through holes VH5 are each, for example, tapered so that the diameter decreases, as viewed in FIG. 1A, from the upper side toward the lower side. In the present example, each through hole VH5 has the shape of a generally inverted truncated cone in which a lower opening end, which is closer to the corresponding electrode terminal 32, has a smaller diameter than an upper opening end, which is closer to the upper surface 24A of the insulation layer 24. The insulation layer 24 has a thickness measured from the upper surface of the wiring layer 13 to the upper surface 24A of the insulation layer 24 that is, for example, approximately 15 to 45 μm.

The wiring layer 14 is stacked on the upper surface 24A of the insulation layer 24. The wiring layer 14 is the outermost wiring layer (here, the uppermost wiring layer) of the wiring substrate 10. The wiring layer 14 includes a first wiring pattern and a second wiring pattern in the same layer. The through holes VH3 and VH4 are filled with via wirings V3 that electrically connect the first wiring pattern (third wiring layer) of the wiring layer 14 to the wiring layer 13. In the present example, the first wiring pattern of the wiring layer 14 is formed integrally with the via wirings V3. Each through hole VH5 is filled with a via wiring V5 that electrically connects the second wiring pattern (sixth wiring layer) of the wiring layer 14 to the corresponding electrode terminal 32. In the present example, the second wiring pattern of the wiring layer 14 is formed integrally with the via wiring VS. The wiring layer 14 may be laid out on the upper surface 24A of the insulation layer 24 in the planar direction (direction orthogonal to the thickness-wise direction in a cross-sectional view). Further, the first wiring pattern of the wiring layer 14, which is connected to the wiring layer 13, may be electrically connected to the second wiring pattern of the wiring layer 14, which is connected to the electrode terminals 32. The wiring layer 14 may have a thickness of, for example, 10 to 20 μm.

In this manner, the two insulation layers 23 and 24 are formed between the wiring layer 13, which is incorporated in the cavity formation insulation layers 22 and 23, and the wiring layer 14. The via wirings V3, which extend through the two insulation layers 23 and 24 in the thickness-wise direction, electrically connect the wiring layer 13 to the wiring layer 14.

The solder resist layer 41 is stacked on the lower surface 21B of the insulation layer 21, which is the outermost insulation layer (here, the lowermost insulation layer). The solder resist layer 41 may be formed from, for example, an insulative resin such as an epoxy resin or an acrylic resin. The solder resist layer 41 may have a thickness of, for example, approximately 10 to 30 μm.

The solder resist layer 41 includes an opening 41X that exposes at least a portion of the wiring layer 11 (lowermost wiring layer) as pads P1. The opening 41X is located at a position corresponding to the region where a semiconductor chip 51 (refer to FIG. 3) is mounted on the wiring substrate 10. For example, the opening 41X exposes the lower surface 11B of the wiring layer 11 and the lower surface 21B of the insulation layer 21 in the mounting region. The solder resist layer 41 also includes openings 41Y that expose portions of the wiring layer 11 as connection pads P2. Each opening 41Y is formed in a region located at the outer side of the opening 41X (i.e., mounting region).

The pads P1 function as, for example, electronic component mounting pads that are electrically connected to another electronic component such as a semiconductor chip. Thus, the surface of the wiring substrate 10 including the pads P1 serves as a chip mounting surface. The connection pads P2 are electrically connected to another wiring substrate or another semiconductor device.

When necessary, a surface-processed layer may be formed on the surfaces of the pads P1 and the surface of each connection pad P2. Examples of a surface-processed layer include a gold (Au) layer, a nickel (Ni) layer/Au layer (metal layer obtained by stacking Ni layer and Au layer in this order), and an Ni layer/palladium (Pd) layer/Au layer (metal layer obtained by stacking Ni layer, Pd layer, and Au layer in this order). The Ni layer, Au layer, and Pd layer may be an electroless plating metal layer, which is formed through electroless plating, or an electrolytic plating metal layer, which is formed through electrolytic plating. The Ni layer is a metal layer of Ni or an Ni alloy. The Au layer is a metal layer of Au or an Au alloy. The Pd layer is a metal layer of Pd or a Pd alloy. Further, a surface-processed layer that undergoes an anti-oxidation process such as an organic solderability preservative (OSP) process may be formed on the surfaces of the pads P1 and the surfaces of the connection pads P2. For example, when undergoing the OSP process, an organic film of an azole compound or an imidazole compound is formed as the surface-processed layer on the surfaces of the pads P1 and the surfaces of the connection pads P2.

The solder resist layer 42 is stacked on the upper surface 24A of the insulation layer 24, which is the outermost insulation layer (here, the uppermost insulation layer). The solder resist layer 42 may be formed from, for example, an insulative resin such as an epoxy resin or an acrylic resin. The solder resist layer 42 may have a thickness of, for example, approximately 10 to 30 μm.

The solder resist layer 42 includes openings 42X that expose portions of the wiring layer 14 as external connection pads P3. The external connection pads P3 are connected to external connection terminals such a solder balls or lead pins used to mount the wiring substrate 10 onto a mounting substrate such as a motherboard. In the first embodiment, the surface of the wiring substrate 10 where the external connection pads P3 are located is defined as the external connection terminal surface. When necessary, a surface-processed layer may be formed on the surfaces of the external connection pads P3. Examples of a surface-processed layer include an Au layer, an Ni layer/Au layer, and an Ni layer/Pd layer/Au layer. Further, for example, an anti-oxidation process such as an OSP process may be performed to form an organic film of an azole compound or an imidazole compound as the surface-processed layer on the surfaces of the external connection pads P3. Further, portions of the wiring layer 14 exposed from the openings 42X may be used as external connection terminals. Alternatively, the surface-processed layer formed on the wiring layer 14 may be used as external connection terminals.

Figure 3:
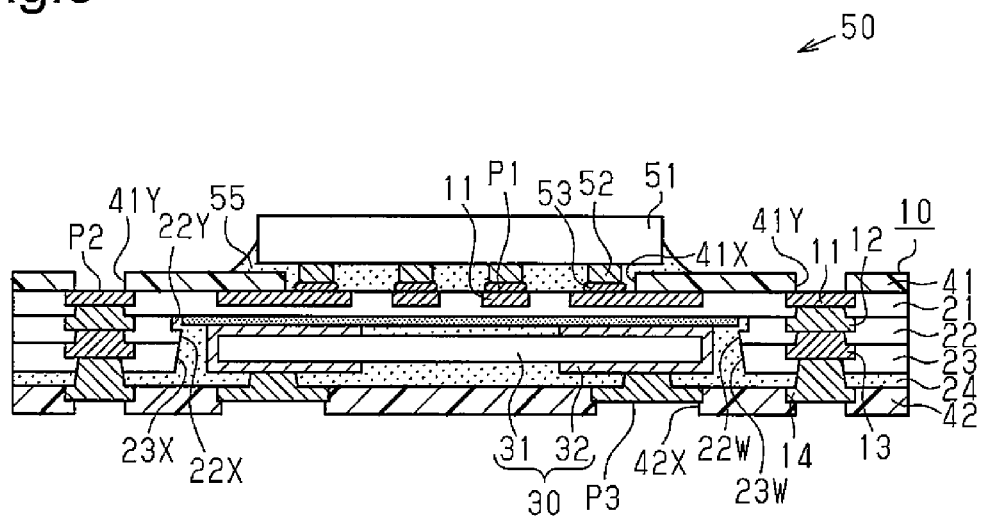
FIG. 3 is a schematic cross-sectional view illustrating a semiconductor device that includes the wiring substrate of FIG. 1A.

The structure of a semiconductor device 50 will now be described with reference to FIG. 3. FIG. 3 illustrates the wiring substrate 10 of FIG. 1A reversed upside down.

The semiconductor device 50 includes the wiring substrate 10, at least one (in this case, one) semiconductor chip 51, and an underfill resin 55. The semiconductor chip 51 is flip-chip-mounted on the wiring substrate 10. In the present example, connection terminals 52, which are arranged on a circuit formation surface (here, lower surface) of the semiconductor chip 51, are bonded to the pads P1 of the wiring substrate 10 by bonding members 53 to electrically connect the semiconductor chip 51 to the pads P1 (wiring layer 11) via the connection terminals 52 and the bonding members 53.

The semiconductor chip 51 may be a logic chip such as a central processing unit (CPU) chip or a graphics processing unit (GPU) chip. Further, the semiconductor chip 51 may be a memory chip such as a dynamic random access memory (DRAM) chip, a static random access memory (SRAM) chip, or a flash memory chip. Moreover, a logic chip and a memory chip or the like may be combined and mounted as a plurality of semiconductor chips 51 on the wiring substrate 10.

The connection terminals 52 may be, for example, metal posts. The connection terminals 52 are rod-shaped connection terminals extending downward from the circuit formation surface of the semiconductor chip 51. The connection terminals 52 may be formed from, for example, copper or a copper alloy. In addition to metal posts, for example, gold bumps may be used as the connection terminals 52.

The bonding members 53 are bonded with the pads P1 and the connection terminals 52. The bonding members 53 may be, for example, a tin (Sn) layer or a solder layer. The solder layer may be formed from, for example, a lead-free solder of Sn-silver (Ag), Sn—Cu, or Sn—Ag—Cu.

The gap between the wiring substrate 10 and the semiconductor chip 51 is filled with the underfill resin 55. The underfill resin 55 may be formed from, for example, an insulative resin such as an epoxy resin.

A method for manufacturing the wiring substrate 10 will now be described. To aid understanding, components that ultimately function as the elements of the wiring substrate 10 are denoted by the reference characters added to such elements.

Figure 4A:
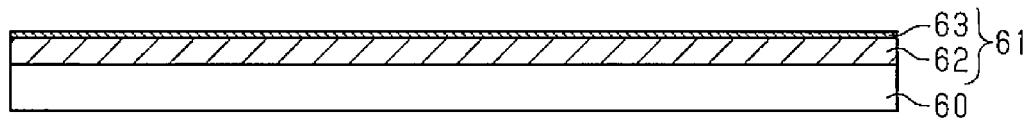

In the step illustrated in FIG. 4A, a carrier-added metal foil 61 is adhered to the upper surface of a support 60. The support 60 may be, for example, a pre-peg, which is obtained by impregnating a reinforcement material, such as a woven cloth or non-woven cloth of glass, aramid, or LCP fibers, with a thermosetting resin such as epoxy resin or polyimide resin. The carrier-added metal foil 61 includes a carrier layer 62 and an extremely thin metal foil 63 stacked on the upper surface of the carrier layer 62 with a defoliation layer (not illustrated) arranged in between. The carrier layer 62 serves as a support material that facilitates handling of the metal foil 63. The carrier layer 62 is, for example, a copper foil having a thickness of approximately 15 to 70 μm. The metal foil 63 is, for example, a copper foil having a thickness of approximately 0.5 to 5 μm.

The material of the carrier layer 62 is not limited to copper and may be a conductive metal layer, which is formed by a metal other than copper, or an insulation layer of resin or the like. Further, the material of the metal foil 63 is not limited to copper and may be a metal other than copper.

Figure 4B:
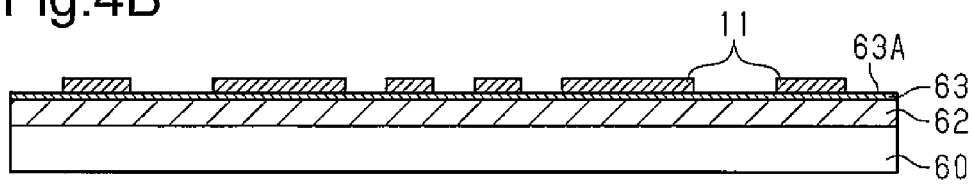

In the step illustrated in FIG. 4B, the wiring layer 11 is formed on the upper surface 63A of the metal foil 63. The wiring layer 11 may be formed through, for example, a semi-additive process. In the present example, a resist pattern (not illustrated), which includes openings shaped in conformance with the wiring layer 11, is first formed on the upper surface 63A of the metal foil 63. Then, electrolytic copper plating is performed using the metal foil 63 as a power supplying layer to deposit a copper plating film on the upper surface 63A of the metal foil 63 exposed from the openings of the resist pattern. The resist pattern is then removed to form the wiring layer 11 on the metal foil 63. In addition to the semi-additive process, various types of wiring formation processes such as a subtractive process may be employed to form the wiring layer 11.

Figure 4C:
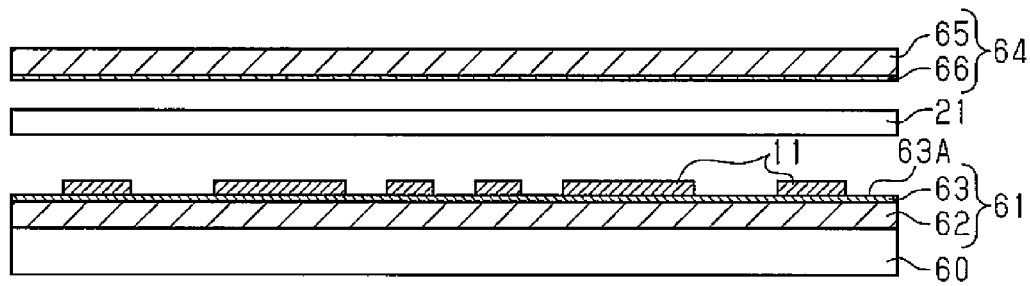

In the step illustrated in FIG. 4C, the insulation layer 21 and a carrier-added metal foil 64 are arranged above the structure illustrated in FIG. 4B. The insulation layer 21 used in the step of FIG. 4C is, for example, a pre-preg that is in a B-stage (i.e., semi-hardened state). The pre-preg is obtained by, for example, impregnating a reinforcement material, such as a woven cloth or non-woven cloth of glass, aramid, or LCP fibers, with a thermosetting resin such as epoxy resin or polyimide resin. An underlayer (not illustrated) is formed on a surface (here, upper surface) of the insulation layer 21 that faces the carrier-added metal foil 64.

In the same manner as the carrier-added metal foil 61, the carrier-added metal foil 64 includes a carrier layer 65 and an extremely thin metal foil 66 stacked on the lower surface of the carrier layer 65 with a defoliation layer (not illustrated) arranged in between. The carrier-added metal foil 64 faces the insulation layer 21.

Then, under a depressurized condition (e.g., vacuum atmosphere), the structure illustrated in FIG. 4C (support 60, carrier-added metal foil 61, wiring layer 11, insulation layer 21, and carrier-added metal foil 64) is heated to a given temperature (e.g., 180° C. to 230° C.) and pressurized in a direction orthogonal to the upper surface 63A of the metal foil 63 in a cross-sectional view (vertical direction as viewed in FIG. 4C). Consequently, the B-stage insulation layer 21 is hardened. Then, the carrier layer 65 is removed from the metal foil 66. In this case, the defoliation layer (not illustrated) is arranged between the carrier layer 65 and the metal foil 66 in the carrier-added metal foil 64. Thus, the adhesive force is weak between the carrier layer 65 and the metal foil 66. This allows the carrier layer 65 to be easily separated from the metal foil 66 and obtain the structure illustrated in FIG. 4D.

The insulation layer 21 may be formed from a resin that does not include a reinforcement material such as a glass cloth or a resin that contains only a filler. A method for forming the insulation layer 21 will now be described. For example, when using a resin film as the insulation layer 21, the resin film is laminated on the upper surface 63A of the metal foil 63. While pressing the resin film, a heat treatment is performed at a temperature that is greater than or equal to the hardening temperature (e.g., approximately 130° C. to 200° C.) to form the insulation layer 21. The resin film may be, for example, a thermosetting resin film of which the main component is an epoxy resin. The insulation layer 21 may be a liquid or paste of an insulative resin. In this case, spin coating is performed to apply a liquid or paste of an insulative resin to the upper surface 63A of the metal foil 63. Then, the applied insulative resin undergoes a heat treatment at a temperature greater than or equal to the hardening temperature. This hardens the insulative resin and forms the insulation layer 21. The liquid or paste of insulative resin may be, for example, a thermosetting resin of which the main component is an epoxy resin.

Figure 5A:
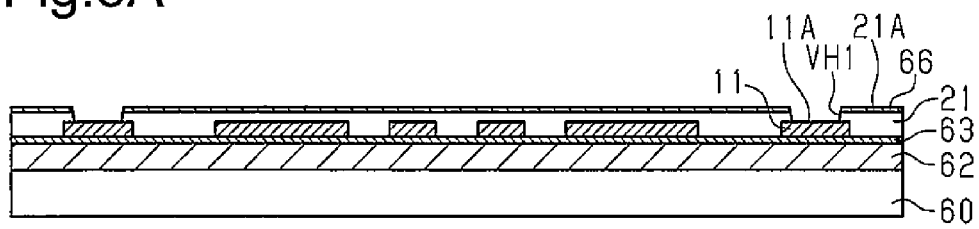

In the step illustrated in FIG. 5A, the through holes VH1, which extend through the insulation layer 21 and the metal foil 66 in the thickness-wise direction, are formed to expose portions of the upper surface 11A of the wiring layer 11. The through holes VH1 may be formed through, for example, laser processing that uses a CO₂ laser or a YAG laser. When the insulation layer 21 is formed from a photosensitive resin, a photolithography process may be performed to form the through holes VH1.

When forming the through holes VH1 through laser processing, a desmear process is performed to remove resin residues (resin smears) of the insulation layer 21 from the upper surface 11A of the wiring layer 11 exposed in the through holes VH1. The desmear process may be performed by using, for example, a permanganate process.

Figure 5B:
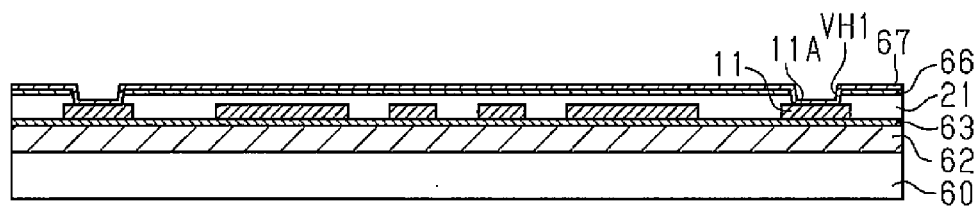

In the step illustrated in FIG. 5B, a seed layer 67 is formed. The seed layer 67 continuously covers the upper surface of the metal foil 66, the wall surfaces defining the through holes VH1 in the insulation layer 21, and the upper surface 11A of the wiring layer 11 exposed in the through holes VH1. The seed layer 67 may be formed through, for example, an electroless plating process (e.g., electroless copper plating process) or a sputtering process. The seed layer 67 may be formed from, for example, copper or a copper alloy.

Figure 5C:
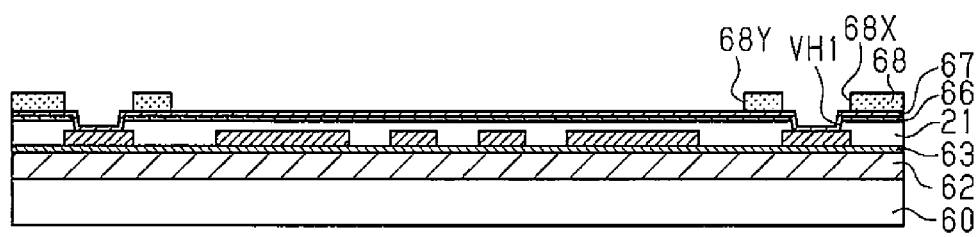

In the step illustrated in FIG. 5C, a resist layer 68, which includes opening patterns 68X and 68Y at given locations, is formed on the seed layer 67. The opening patterns 68X expose the seed layer 67 at portions corresponding to the regions where the wiring layer 12 is formed (refer to FIG. 1A). The opening pattern 68Y exposes the seed layer 67 at a portion corresponding to the region where the chip capacitor 30 is mounted. For example, the opening pattern 68Y is larger than the opening 22X (refer to FIG. 1A) in a plan view.

The resist layer 68 may be formed from a material that is resistant to plating in the following plating process. For example, the resist layer 68 may be a photosensitive dry film resist or a photoresist liquid. Such a material of the resist layer 68 may be, for example, a novolac resin or an acrylic resin. For example, when using a photosensitive dry film resist, thermocompression bonding is performed to laminate a dry film on the upper surface of the seed layer 67, and a photolithography process is performed to pattern the dry film and form the resist layer 68 that includes the opening patterns 68X and 68Y. When using a photoresist liquid, similar steps are performed to form the resist layer 68.

Figure 5D:
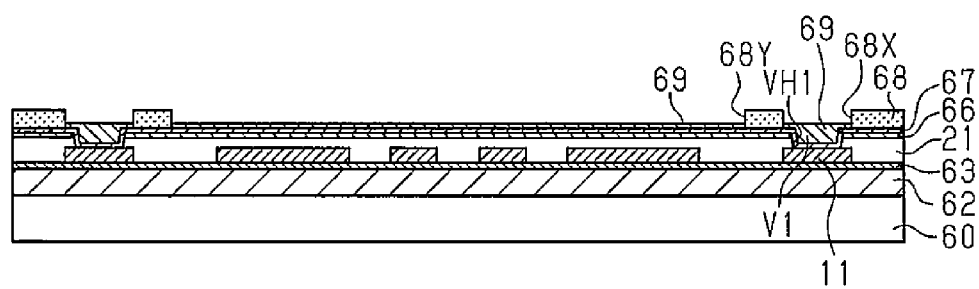

In the step illustrated in FIG. 5D, electrolytic plating is performed on the upper surface of the seed layer 67 using the resist layer 68 as a plating mask and the seed layer 67 as a plating power supplying layer. In the present example, electrolytic copper plating is performed to form an electrolytic copper plating layer 69 on the upper surface of the seed layer 67 exposed in the opening patterns 68X and 68Y of the resist layer 68.

Figure 6A:
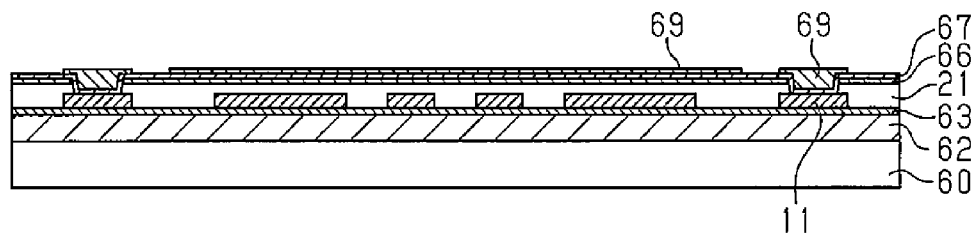
Figure 6B:
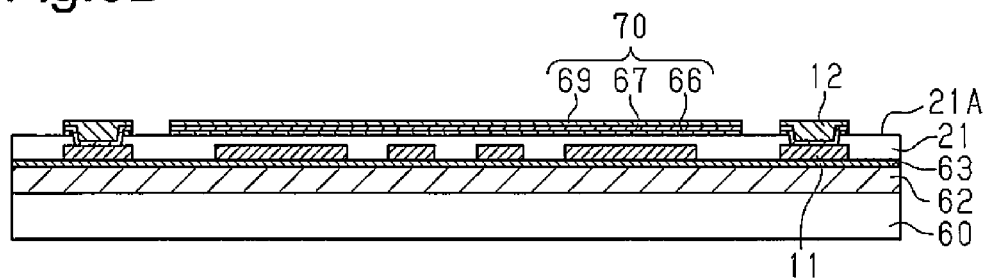
Figure 6C:
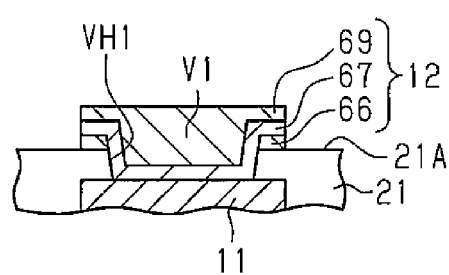

Then, for example, an alkaline defoliation liquid is used to remove the resist layer 68. This obtains the structure illustrated in FIG. 6A. Further, etching is performed using the electrolytic copper plating layer 69 as an etching mask to remove the seed layer 67 and the metal foil 66 that are unnecessary. As illustrated in FIG. 6B, this forms the metal layer 70 on the upper surface 21A of the insulation layer 21. The metal layer 70, which is larger than the mounting region of the chip capacitor 30 (refer to FIG. 1A), includes the metal foil 66, the seed layer 67, and the electrolytic copper plating layer 69. As illustrated in FIG. 6C, the through holes VH1 are simultaneously filled with the via wirings V1, which is formed by the seed layer 67 and the electrolytic copper plating layer 69. Further, the wiring layer 12 is formed simultaneously on the upper surface 21A of the insulation layer 21 by the metal foil 66, the seed layer 67, and the electrolytic copper plating layer 69.

Figure 4D:
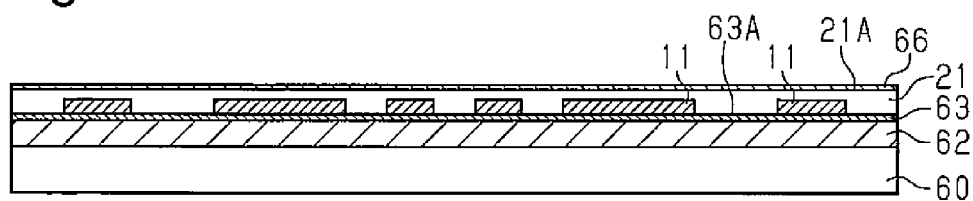
Figure 6D:
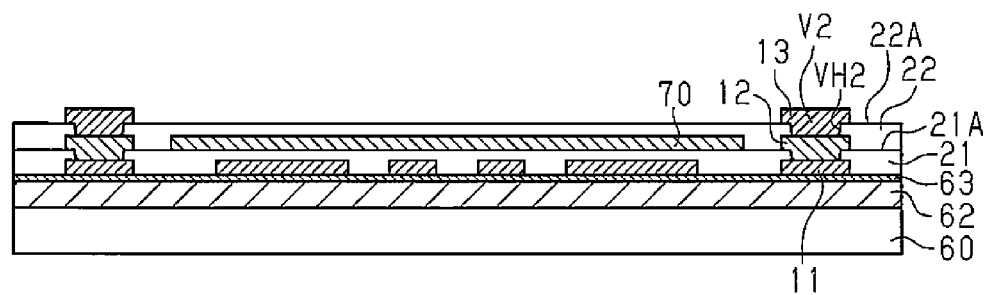

In the step illustrated in FIG. 6D, the insulation layer 22, which covers the wiring layer 12 and the metal layer 70, is formed on the upper surface 21A of the insulation layer 21 in the same manner as the steps illustrated in FIGS. 4C and 4D. Then, the through holes VH2 are formed in the via wirings V2 in the same manner as the steps illustrated in FIGS. 5A to 6B. The wiring layer 13, which is electrically connected to the wiring layer 12 by the via wirings V2, is then formed on the upper surface 22A of the insulation layer 22.

Figure 7A:
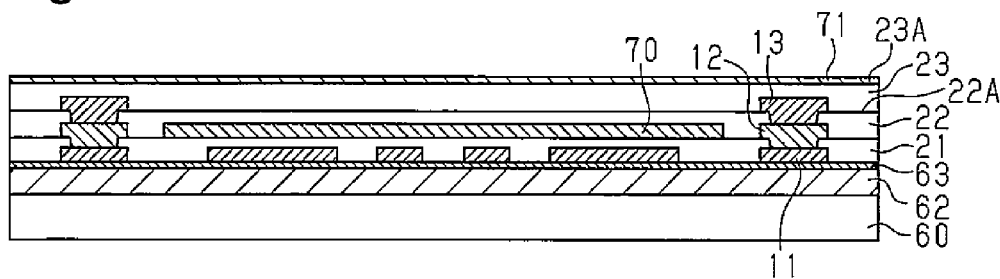
Figure 7B:
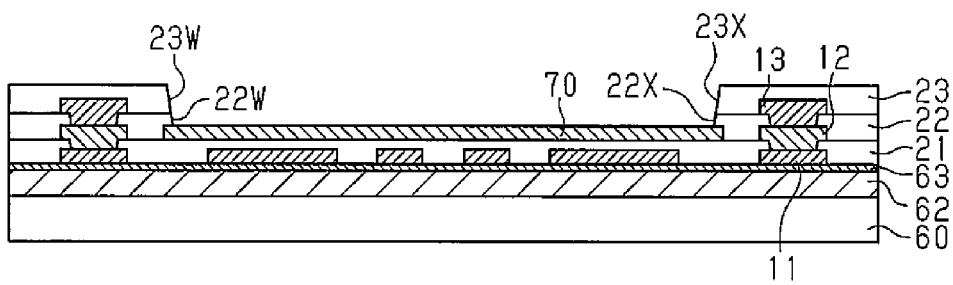

Then, in the step illustrated in FIG. 7A, the insulation layer 23, which entirely covers the surfaces (upper surface and side surfaces) of the wiring layer 13, is stacked on the upper surface 22A of the insulation layer 22 in the same manner as the steps illustrated in FIGS. 4C and 4D. Then, a metal foil 71 is stacked on the upper surface 23A of the insulation layer 23. The metal foil 71 entirely covers the upper surface 23A.

Subsequently, etching is performed to remove the metal foil 71. In the step illustrated in FIG. 7B, the opening 23X, which extends through the insulation layer 23 in the thickness-wise direction, and the opening 22X, which extends through the insulation layer 22 in the thickness-wise direction and is in communication with the opening 23X, are formed to expose the metal layer 70 at a portion corresponding to the mounting region of the chip capacitor 30 (refer to FIG. 1A). The opening 22X is smaller than the metal layer 70 in a plan view. Thus, the peripheral portion of the metal layer 70 is covered by the insulation layer 22. The openings 22X and 23X may be formed through laser processing that uses a $CO_2$ laser or a YAG laser. In such a case, the metal layer 70 functions as a stopper layer during laser processing. This limits damages, which would be caused by excessive laser processing, to the insulation layer 21 that is located under the insulation layer 22.

Alternatively, the metal foil 71 (refer to FIG. 7A) may be used as a conformal mask to form the openings 22X and 23X. For example, the metal foil 71 is etched and patterned to form an opening (not illustrated) having the same shape in a plan view as the openings 22X and 23X. Then, laser processing is performed on the insulation layers 22 and 23 exposed in the opening of the metal foil 71 to form the openings 22X and 23X in the insulation layers 22 and 23. Further, etching is performed to remove the metal foil 71. In this case, the metal foil 71, which is patterned during the etching, functions as a mask during laser processing. This allows the openings 22X and 23X to be accurately formed with the desired shape. Further, the metal layer 70 also functions as a stopper layer during laser processing in this case. This limits damages to the insulation layer 21.

When the insulation layers 22 and 23 are formed from a photosensitive resin, a photolithography process may be performed to form the openings 22X and 23X.

Figure 7C:
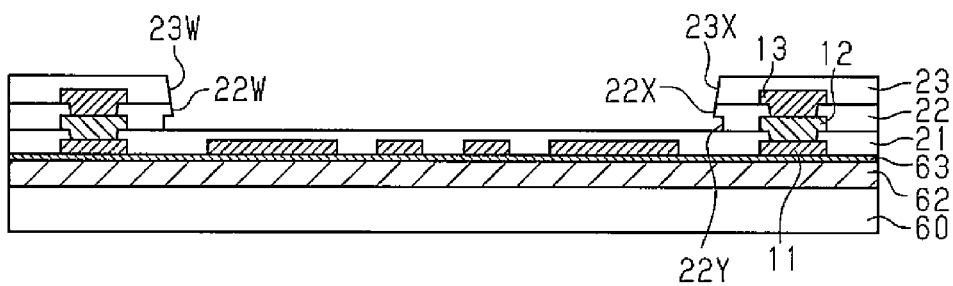
Figure 7D:
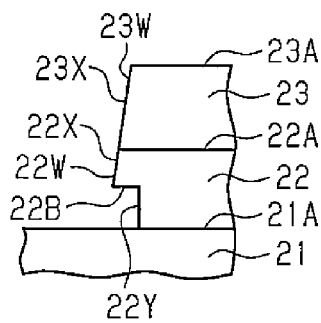
Figure 7E:
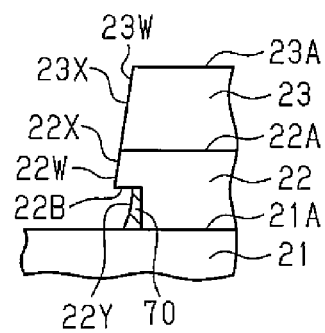

In the step illustrated in FIG. 7C, etching is performed to remove the metal layer 70. For example, isotropic etching is performed using the insulation layers 22 and 23 as an etching mask to remove the metal layer 70. The isotropic etching causes a side etching effect in which etching occurs in the planar direction of the metal layer 70. This removes the metal layer 70, which is covered by the insulation layer 22. Consequently, as illustrated in FIG. 7C, the recess 22Y is formed below the opening 22X by the lower portion of the stepped inner wall surface 22W of the insulation layer 22. In this case, depending on conditions of the etching process (e.g., processing time), the metal layer 70 covered by the insulation layer 22 may be completely removed as illustrated in FIG. 7D or be partially left as illustrated in FIG. 7E. However, as long as at least a portion of the metal layer 70 covered by the insulation layer 22 is removed when the recess 22Y is formed, the metal layer 70 may be partially left in the recess 22Y. When the metal layer 70 is partially left in the recess 22Y, the recess 22Y is defined by the region surrounded by the side surface of the metal layer 70, the lower surface 22B of the insulation layer 22, and the upper surface 21A of the insulation layer 21 as illustrated in FIG. 7E.

Figure 8A:
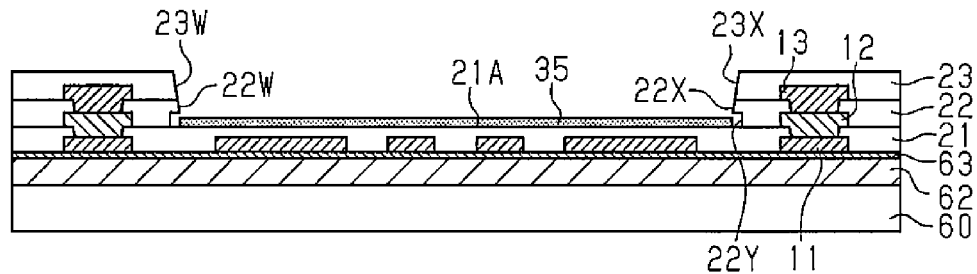

In the step illustrated in FIG. 8A, the adhesive layer 35 is formed on the upper surface 21A of the insulation layer 21 that is exposed in the openings 22X and 23X. The adhesive layer 35 is formed by, for example, applying a liquid of a resin or a paste of a resin to the upper surface 21A of the insulation layer 21. The adhesive layer 35 is formed from, for example, an adhesive of an epoxy resin. In the present example, the adhesive layer 35 is in an A-stage (state before hardening) in the step illustrated in FIG. 8A. However, in this step, the adhesive layer 35 may instead be in a B-stage.

Figure 8B:
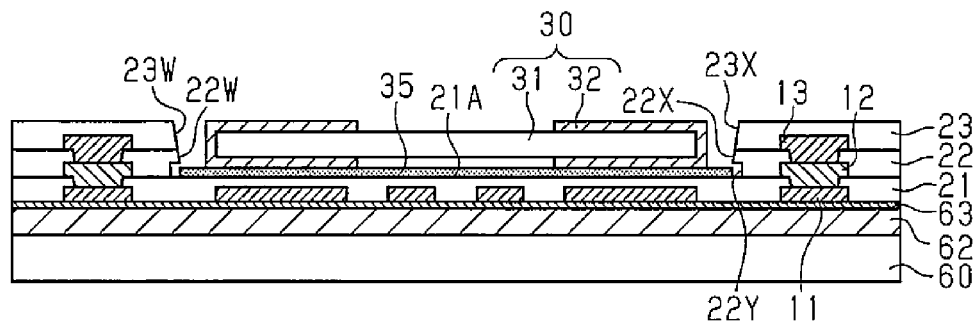

In the step illustrated in FIG. 8B, a mounter is used to mount the chip capacitor 30 on the adhesive layer 35 in the openings 22X and 23X. The lower surface of each electrode terminal 32 of the chip capacitor 30 is fixed to the upper surface of the adhesive layer 35.

Figure 8C:
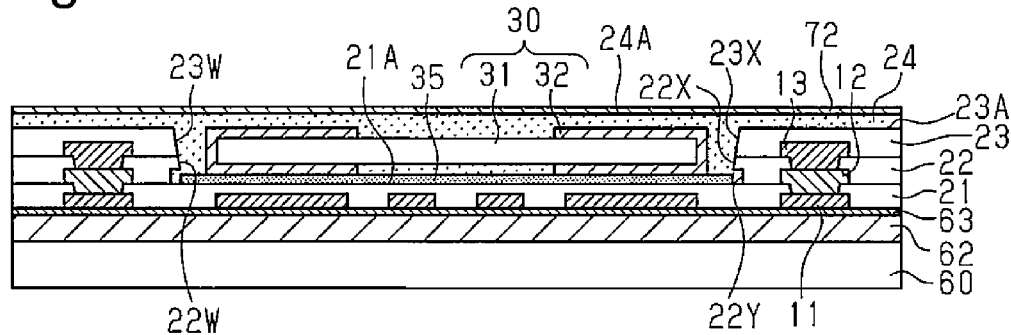

In the step illustrated in FIG. 8C, the insulation layer 24, which entirely covers the upper surface 23A of the insulation layer 23, and a metal foil 72, which entirely covers the upper surface 24A of the insulation layer 24, are sequentially stacked in the same manner as the steps illustrated in FIGS. 4C and 4D. The openings 22X and 23X and the recess 22Y are filled with the insulation layer 24. Accordingly, the insulation layer 24 entirely covers the surfaces of the chip capacitor 30 that are not in contact with the adhesive layer 35. The upper surface 23A of the insulation layer 23 lies along the same plane as the upper surface of each electrode terminal 32 of the chip capacitor 30 or is located upward from the upper surface of each electrode terminal 32. This allows the upper surface 24A of the insulation layer 24 to be formed flat. Further, the openings 22X and 23X are each tapered so that the width decreases from the upper side toward the lower side as viewed in FIG. 8C. This allows the gap between the chip capacitor 30 and the insulation layers 22 and 23 to be efficiently filled with resin and limits the formation of voids in the insulation layer 24.

Figure 8D:
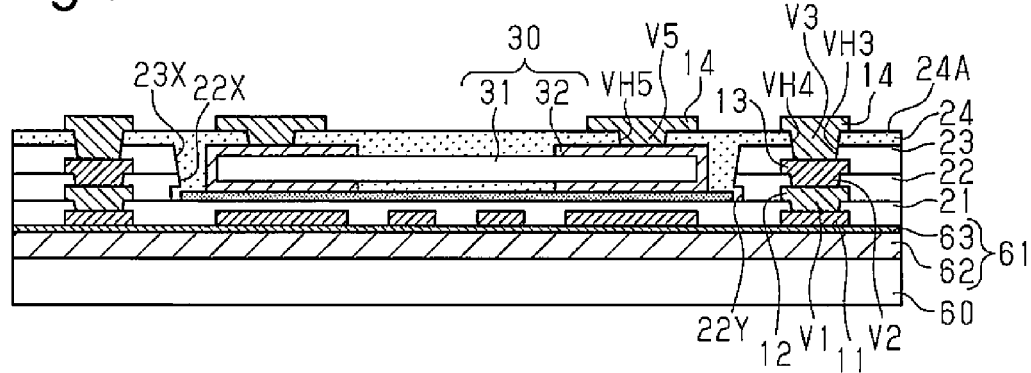

In the step illustrated in FIG. 8D, the through holes VH4 and VH5 are formed extending through the insulation layer 24 at given locations in the same manner as the step illustrated in FIG. 5A. Further, the through holes VH3 are formed extending through the insulation layer 23 in communication with the through holes VH4 at given locations. Then, in the same manner as the steps illustrated in FIGS. 5B to 6B, the through holes VH3 and VH4 are filled with the via wirings V3, and the through holes VH5 are filled with the via wirings V5. Further, the wiring layer 14 is stacked on the upper surface 24A of the insulation layer 24. The wiring layer 14 includes the first wiring pattern, which is electrically connected to the wiring layer 13 by the via wirings V3, and the second wiring pattern, which is electrically connected to the electrode terminals 32 by the via wirings VS.

Figure 9A:
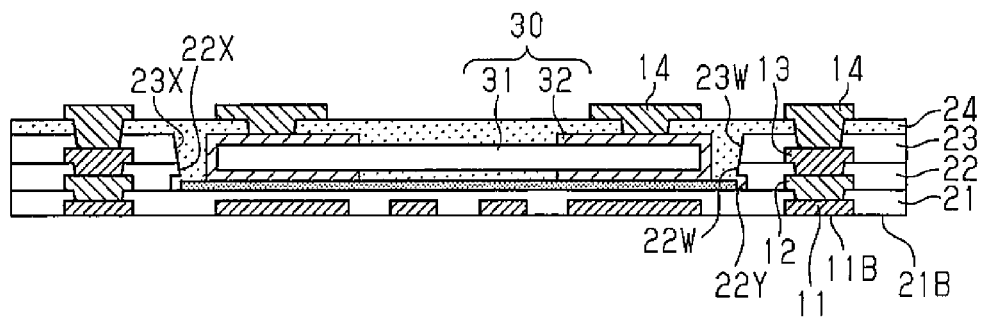

Then, the support 60 and the carrier-added metal foil 61 (carrier layer 62 and metal foil 63) are removed. For example, the carrier layer 62 and the support 60 are mechanically separated from the metal foil 63. The defoliation layer (not illustrated) arranged between the carrier layer 62 and the metal foil 63 weakens the adhesive force between the carrier layer 62 and the metal foil 63. This allows the carrier layer 62 and the support 60 to be easily separated from the metal foil 63. Then, etching is performed to remove the metal foil 63. When the outermost layer of the wiring layer 14 is a Cu layer, the wiring layer 14 is masked during etching to prevent the wiring layer 14 from being etched together with the metal foil 63. Consequently, as illustrated in FIG. 9A, the lower surface 1ib of the wiring layer 11 and the lower surface 21B of the insulation layer 21 are exposed to the outside.

Figure 9B:
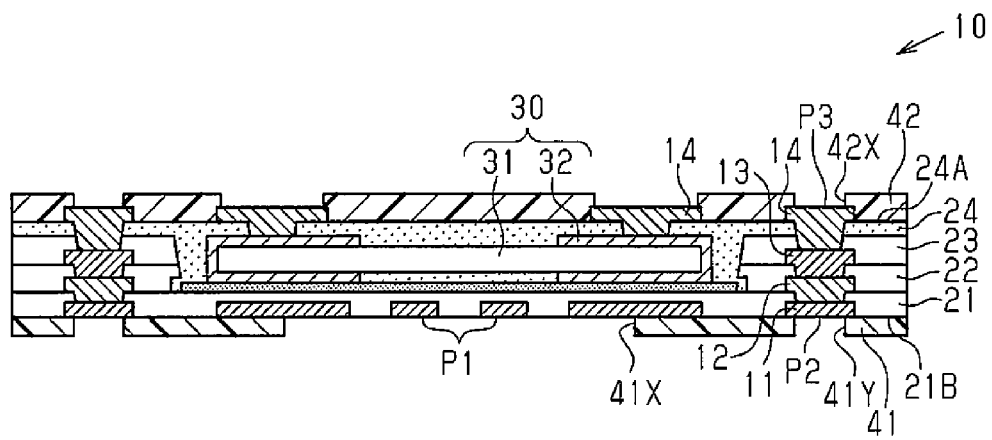

In the step illustrated in FIG. 9B, the solder resist layer 41, which includes the openings 41X and 41Y, is stacked on the lower surface 21B of the insulation layer 21, and the solder resist layer 42, which includes the openings 42X, is stacked on the upper surface 24A of the insulation layer 24. The solder resist layers 41 and 42 may be formed by, for example, laminating a photosensitive solder resist film to a subject surface or applying a solder resist liquid to the subject surface and then patterning the resist into the given shape. The wiring layer 11 exposed from the opening 41X serves as the connection pads P1, the wiring layer 11 exposed from the openings 41Y serves as the connection pads P2, and the wiring layer 14 exposed from the opening 42X serves as the external connection pads P3. When necessary, for example, a metal layer (surface-processed layer), in which an Ni layer and an Au layer are stacked in this order may be formed on the pads P1, the connection pads P2, and the external connection pads P3. The metal layer may be formed through, for example, an electroless plating process. The steps described above allow the wiring substrate 10 illustrated in FIG. 1A to be manufactured.

A method for manufacturing the semiconductor device 50 will now be described.

Figure 9C:
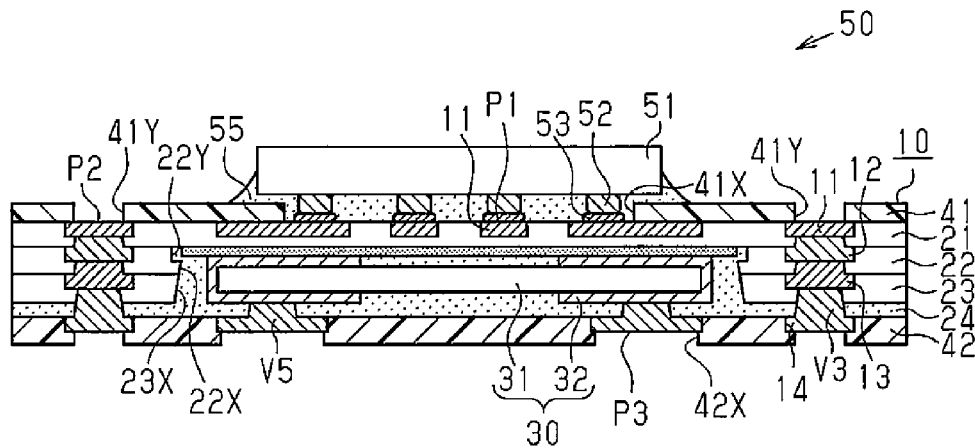
FIG. 9C is a schematic cross-sectional view illustrating a method for manufacturing the semiconductor device of FIG. 3.

In the step illustrated in FIG. 9C, the semiconductor chip 51, which includes the rod-shaped connection terminals 52, is prepared. The connection terminals 52 may be formed through a known method. Thus, the method for forming the connection terminals 52 are not illustrated in the drawings and will not be described in detail. For example, the connection terminals 52 may be formed through the method described below.

A protective film including openings for exposing electrode pads, for example, is formed on the circuit formation surface (here, lower surface) of the semiconductor chip 51. Then, a seed layer is formed covering the lower surface of the protective film and the lower surface of the electrode pads. A resist layer is then formed. The resist layer exposes portions of the seed layer at regions where the connection terminals 52 are formed (seed layer covering lower surfaces of electrode pads). Then, electrolytic plating (e.g., electrolytic copper plating) is performed using the seed layer exposed from the resist layer as a power supplying layer to form the rod-shaped connection terminals 52 on the electrode pads.

The bonding members 53 are then formed on the lower surface of the connection terminals 52. For example, electrolytic solder plating is performed, using the resist layer formed on the seed layer as a plating mask and using the seed layer as a plating power supplying layer, to apply solder to the lower surface of the connection terminals and form the bonding members 53. Then, the seed layer and the resist layer that are unnecessary are removed.

Further, the connection terminals 52 of the semiconductor chip 51 are flip-chip-bonded onto the pads P1 (wiring layer 11) of the wiring substrate 10. For example, after positioning the wiring substrate 10 and the semiconductor chip 51, a reflow process is performed to melt the bonding members 53 (solder plating layer) and electrically connect the connection terminals 52 to the pads P1.

Then, the gap between the semiconductor chip 51 and the wiring substrate 10, which are flip-chip-bonded, is filled with the underfill resin 55, which is hardened. The steps described above allow the semiconductor device 50 illustrated in FIG. 3 to be manufactured.

The first embodiment has the advantages described below.

(1) The two insulation layers 22 and 23 stacked on the insulation layer 21 serve as cavity formation insulation layers. Further, the wiring layer 13 is incorporated in the insulation layers 22 and 23. The upper surface 23A of the insulation layer 23 is free from wiring layers, and the insulation layer 24, with which the cavity is filled, is formed on the upper surface 23A of the insulation layer 23. Further, the wiring layer 14 is formed on the upper surface 24A of the insulation layer 24 and electrically connected to the wiring layer 13 by the via wirings VS, which extend through the insulation layers 23 and 24 in the thickness-wise direction. This limits differences in the thickness of the insulation layers 21 to 24 and allows the wiring substrate 10 to be entirely reduced in thickness.

Figure 23:
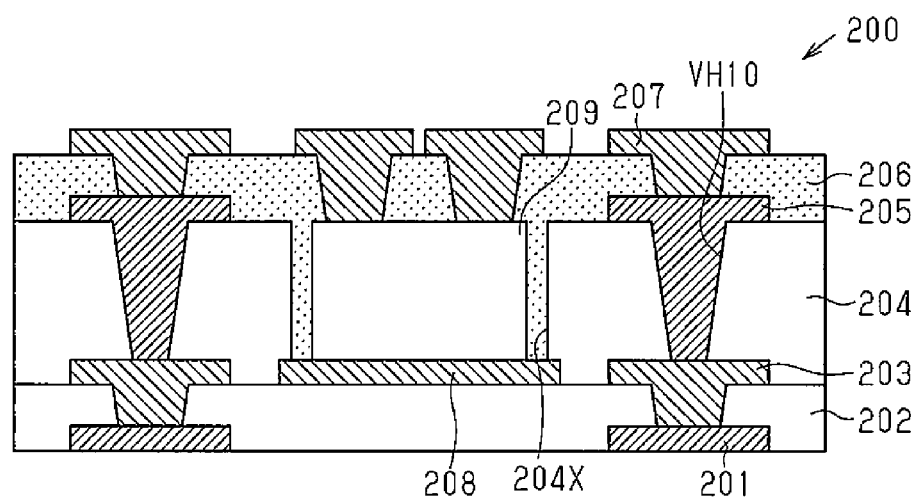
FIG. 23 is a schematic cross-sectional view illustrating a wiring substrate in the related art.

(2-1) The reason differences in the thickness of the insulation layers 21 to 24 are limited in advantage (i) will now be described. In the wiring substrate 200 illustrated in FIG. 23, the single insulation layer 204 is used as the cavity formation insulation layer. Thus, the thickness of the insulation layer 204 is affected and restricted by the thickness of the electronic component 209. In contrast, the present example includes the two insulation layers 22 and 23 that serve as the cavity formation insulation layer. Thus, the total thickness of the insulation layers 22 and 23 is affected by the thickness of the chip capacitor 30. However, the thickness of each of the insulation layers 22 and 23 may be set regardless of the thickness of the chip capacitor 30.

For example, the thickness of each of the chip capacitor 30 and the electronic component 209 may be set to 100 μm, the depth of the cavity may be set to 105 μm, the thickness of each of the wiring layers 11 to 13, 201, 203, and 205 may be set to 15 μm, and the minimum thickness of each of the insulation layers 21 to 24, 202, 204, and 206 may be set to 25 μm.

In this case, in the wiring substrate 200, the cavity is formed by only the single insulation layer 204. Thus, when the thickness of the wiring layer 203 is 15 μm, the thickness of the insulation layer 204 measured from the upper surface of the wiring layer 203 to the upper surface of the insulation layer 204 needs to be set to 90 μm or greater. In the wiring substrate 200, the thickness of the insulation layer 202 measured from the upper surface of the wiring layer 201 to the upper surface of the insulation layer 202 may be set to 25 μm. Further, the thickness of-the insulation layer 206 measured from the upper surface of the wiring layer 205 to the upper surface of the insulation layer 206 may be set to 25 μm. Accordingly, in the wiring substrate 200, the thickness of the insulation layer 204 is greater than or equal to three times the thickness of each of the other insulation layers 202 and 206. This decreases the diameter of the lower opening end (bottom diameter) of each through hole VH10 that extends through the insulation layer 204 and exposes the upper surface of the wiring layer 203. Thus, the reliability of the connection between the wiring layer 203 and the wiring layer 205 may be lowered.

In contrast, in the wiring substrate 10, the total thickness of the wiring layers 12 and 13 incorporated in the insulation layers 22 and 23 is 30 μm. Thus, for example, when the thickness of the insulation layer 23 measured from the upper surface of the wiring layer 13 to the upper surface 23A of the insulation layer 23 is set to 25 μm, the thickness of the insulation layer 22 measured from the upper surface of the wiring layer 12 to the upper surface 22A of the insulation layer 22 may be set to 50 μm. Further, since the thickness of the insulation layer 24 may be set to 25 μm, the total thickness of the insulation layers 23 and 24 may be set to 50 μm. Accordingly, the thickness of the insulation layer 22 in the first embodiment may be limited to approximately two times the thickness of the insulation layer 21. Further, the total thickness of the insulation layers 23 and 24 may also be limited to approximately two times the thickness of the insulation layer 21. Thus, differences in the thickness of the insulation layers 21 to 24 may be reduced. As a result, situations are limited in which the diameter of the lower opening end of each of the through holes VH2, VH3, and VH4 is decreased. Accordingly, as compared to the wiring substrate 200, the connection reliability is improved between the wiring layer 12 and the wiring layer 13 and between the wiring layer 13 and the wiring layer 14.

(2-2) The reason the wiring substrate 10 is entirely reduced in thickness in advantage (1) will now be described. The wiring substrate 200 includes the wiring layer 205 formed on the upper surface of the insulation layer 204. Thus, the wiring layer 205 needs to be covered by the insulation layer 206, which is located on the insulation layer 204. This increases the thickness of the entire wiring substrate 200. In the example described above, the thickness of the wiring layer 201 is set to 15 μm, the thickness of the insulation layer 202 is set to 25 µm, the thickness of the wiring layer 203 is set to 15 µm, the thickness of the insulation layer 204 is set to 90 µm, the thickness of the wiring layer 205 is set to 15 µm, the thickness of the insulation layer 206 is set to 25 µm, and the thickness of the wiring layer 207 is set to 15 µm. Thus, in the wiring substrate 200, the thickness of the entire wiring substrate 200 from the lower surface of the wiring layer 201 to the upper surface of the wiring layer 207 is 200 µm (15+25+15+90+15+25+ 15=200).

In contrast, in the wiring substrate 10, a wiring layer is not formed on the upper surface 23A of the cavity formation insulation layer 23. The wiring layer 14, which is electrically connected to the wiring layer 13 by the via wirings V3 extending through the insulation layers 23 and 24, is formed on the upper surface 24A of the insulation layer 24, with which the cavity is filled. Thus, the entire wiring substrate 10 is thinner than the wiring substrate 200 by an amount corresponding to the thickness of a single wiring layer (wiring layer 205 in FIG. 23). In the example described above, the thickness of the wiring layer 11 is set to 15 µm, the thickness of the insulation layer 21 is set to 25 µm, the thickness of the wiring layer 12 is set to 15 µm, the thickness of the insulation layer 22 is set to 50 µm, the thickness of the wiring layer 13 is set to 15 µm, the thickness of the insulation layer 23 is set to 25 µm, the thickness of the insulation layer 24 is set to 25 µm, and the thickness of the wiring layer 14 is set to 15 µm. Thus, in the wiring substrate 10, the thickness of the entire wiring substrate 10 from the lower surface lib of the wiring layer 11 to the upper surface of the wiring layer 14 is 185 µm (15+25+15+50+15+25+ 25+15=185). Accordingly, the entire wiring substrate 10 is thinner than the entire wiring substrate 200, which includes the same number of wiring layers (in this case, four) as the wiring substrate 10.

(3) The insulation layer 22 includes the stepped inner wall surface 22W, and the insulation layer 23 includes the inner wall surface 23W that is continuous with the stepped inner wall surface 22W. The inner wall surface 23W defines the opening 23X, and the upper portion of the stepped inner wall surface 22W defines the opening 22X that is in communication with the opening 23X. The lower portion of the stepped inner wall surface 22W defines the recess 22Y. The recess 22Y has a larger width than the opening 22X. The inner wall surface 23W of the insulation layer 23, the stepped inner wall surface 22W of the insulation layer 22, and the upper surface 21A of the insulation layer 21 encompass a region (openings 22X and 23X and recess 22Y) that define a cavity. The recess 22Y and the openings 22X and 23X are filled with the insulation layer 24, which is stacked on the upper surface 23A of the insulation layer 23. Thus, a portion of the insulation layer 24 (insulation layer 24 in recess 22Y) is included below the lower surface 22B of the insulation layer 22. This produces an anchoring effect that improves the adhesion of the insulation layers 22 and 23, which form the cavity, and the insulation layer 24, with which the cavity is filled, as compared with when the recess 22Y is not formed. Accordingly, even when the wiring substrate 10 warps, separation of the insulation layer 24 from the insulation layer 22 is limited.

(4) The chip capacitor 30 is accommodated in the openings 22X and 23X (cavity) that extend through the insulation layers 22 and 23 stacked on the upper surface 21A of the insulation layer 21. When, for example, the insulation layer 21 is reduced in thickness to form the cavity, the thickness of the insulation layer 21 is reduced between the chip capacitor 30, which is arranged in the cavity, and the wiring layer 11. This would lower the reliability of the insulation between the chip capacitor 30 and the wiring layer 11. In this regard, the first embodiment forms the cavity in only the insulation layers 22 and 23 without reducing the thickness of the insulation layer 21. Thus, the thickness of the insulation layer 21 is sufficient between the chip capacitor 30 and the wiring layer 11. This improves the reliability of the insulation between the chip capacitor 30 and the wiring lager 11.

(5) The adhesive layer 35 and the wiring layer 12 lie along the same plane. Thus, the wiring substrate 10 is entirely reduced in thickness as compared with when the adhesive layer 35 is located upward from the wiring layer 12. Further, a large distance is obtained between the chip capacitor 30 and the wiring layer 11 as compared with when, for example, the adhesive layer 35 is located downward from the wiring layer 12. This improves the reliability of the insulation between the chip capacitor 30 and the wiring layer 11.

(6) The metal layer 70 is formed on the upper surface 21A of the insulation layer 21, and the insulation layers 22 and 23 are formed entirely covering the surfaces of the metal layer 70. Then, laser processing is performed to form the openings 22X and 23X, which are smaller than the metal layer 70, in the insulation layers 22 and 23. In this manner, the metal layer 70 exists when the openings 22X and 23X are formed. This limits reduction in the thickness of the insulation layer 21 during laser processing. Further, subsequent to the formation of the openings 22X and 23X, isotropic etching is performed to remove the metal layer 70 that is larger than the openings 22X and 23X. This facilitates the formation of the recess 22Y in the bottom portion of the opening 22X.

(7) The openings 22X and 23X of the insulation layers 22 and 23 is tapered and has a width that decreases from the upper surface 23A toward the insulation layer 21. This improves the efficiency for filling the gap between the insulation layers 22 and 23 and the chip capacitor 30 with resin when forming the insulation layer 24 in the openings 22X and 23X. Thus, the formation of voids in the insulation layer 24 is limited.

(8) The wiring substrate 10 is a coreless wiring substrate. This reduces the thickness of the entire wiring substrate 10 as compared with a build-up wiring substrate including a core substrate.

Second Embodiment

A second embodiment will now be described with reference to FIGS. 10A to 12D. A wiring substrate 10A of the second embodiment differs from the wiring substrate 10 of the first embodiment in that a wiring layer 15 is stacked on the chip mounting surface. The description hereafter will focus on differences from the first embodiment. Same reference numerals are given to those components that are the same as the corresponding components illustrated in FIGS. 1A to 9C. Such components will not be described in detail.

Figure 10A:
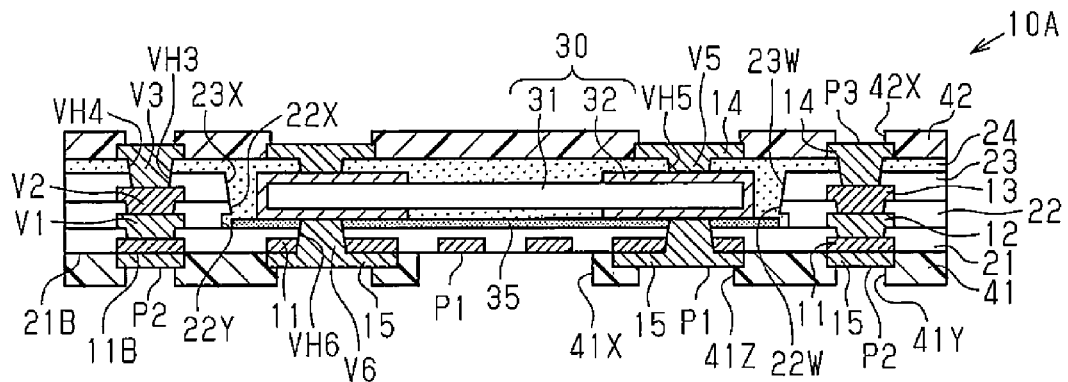
FIG. 10A is a schematic cross-sectional view illustrating a second embodiment of a wiring substrate.

As illustrated in FIG. 10A, the wiring layer 15 of the wiring substrate 10A projects downward from the lower surface 21B of the insulation layer 21. In the present example, the wiring layer 15 is stacked directly on the lower surface lib of the wiring layer 11 and connected directly to the wiring layer 11. That is, the wiring layer 15 is located at positions overlapped with the wiring layer 11 in a plan view.

Figure 10B:
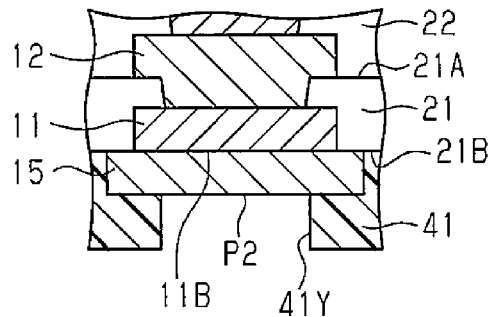
FIGS. 10B and 10C are partially enlarged cross-sectional views of the wiring substrate illustrated in FIG. 10A.
Figure 10C:
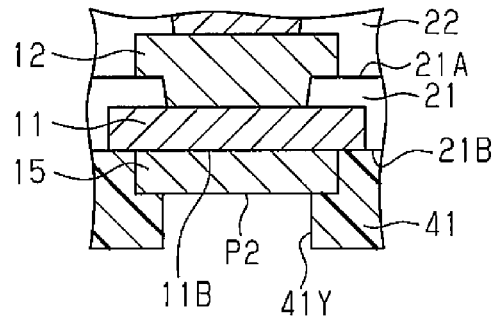

In the example illustrated in FIG. 10A, the wiring layer 15 is completely overlapped with the wiring layer 11 in a plan view but does not necessarily have to be overlapped in such a manner. For example, as illustrated in FIG. 10B, the wiring layer 15 may be larger than the wiring layer 11 in a plan view. Alternatively, for example, as illustrated in FIG. 10C, the wiring layer 15 may be smaller than the wiring layer 11 in a plan view. Further, for example, the wiring layer 15 may be laid out in the planar direction on the lower surface 21B of the insulation layer 21 at portions where the wiring layer 11 is not formed. In this case and in the case of the example illustrated in FIG. 10B, the wiring layer 15 is formed on the lower surface 11B of the wiring layer 11 and the lower surface 21B of the insulation layer 21.

Referring to FIG. 10A, the wiring layer 15 includes a first wiring pattern (fifth wiring layer) and a second wiring pattern (seventh wiring layer) in the same layer. The first wiring pattern (fifth wiring layer) of the wiring layer 15 is directly connected to the wiring layer 11 (first wiring layer), which is electrically connected to the wiring layer 12. The second wiring pattern (seventh wiring layer) of the wiring layer 15 is electrically connected to the electrode terminals 32 of the chip capacitor 30. In the present example, through holes VH6 extend through the wiring layer 11, the insulation layer 21 (first insulation layer), and the adhesive layer 35 to partially expose the lower surface of the electrode terminals 32. The through holes VH6 are filled with via wirings V6 (sixth via wirings). Each through hole VH6 is, for example, tapered so that the diameter decreases, as viewed in FIG. 10A, from the lower side toward the upper side. That is, the through hole VH6 includes an upper opening end, which is closer to the chip capacitor 30, and a lower opening end, which is closer to the lower surface 21B of the insulation layer 21, and the upper opening end has a smaller diameter than the lower opening end. The via wirings V6 electrically connect the second wiring pattern of the wiring layer 15 to the electrode terminals 32. For example, the second wiring pattern of the wiring layer 15 is formed integrally with the via wirings V6. Further, the second wiring pattern of the wiring layer 15 is directly connected to the wiring layer 11 and the via wirings V6. The wiring layer 11 may be omitted from between the second wiring pattern of the wiring layer 15 and the electrode terminals 32. In this case, the second wiring pattern of the wiring layer 15, electrically connected to the electrode terminal 32, is stacked on the lower surface 21B of the insulation layer 21.

The solder resist layer 41 includes the opening 41X exposing at least a portion of the wiring layer 11 as the pads P1. The opening 41X is located at a position corresponding to the mounting region of the semiconductor chip 51 (refer to FIG. 3). For example, the opening 41X partially exposes the lower surface 11B of the wiring layer 11 and the lower surface 21B of the insulation layer 21 in the mounting region. The wiring layer 15 is not formed immediately below the wiring layer 11 that is exposed in the opening 41X. The solder resist layer 41 also includes openings 41Z that expose portions of the wiring layer 15 as the pads PI. The openings 41Z expose portions of the lower surface of the wiring layer 15 in the mounting region. Further, the solder resist layer 41 includes the openings 41Y that expose portions of the wiring layer 15 as the connection pads P2.

A method for manufacturing the wiring substrate 10A will now be described. To aid understanding, components that ultimately function as the elements of the wiring substrate 10A are denoted by the reference characters added to such elements.

Figure 11A:
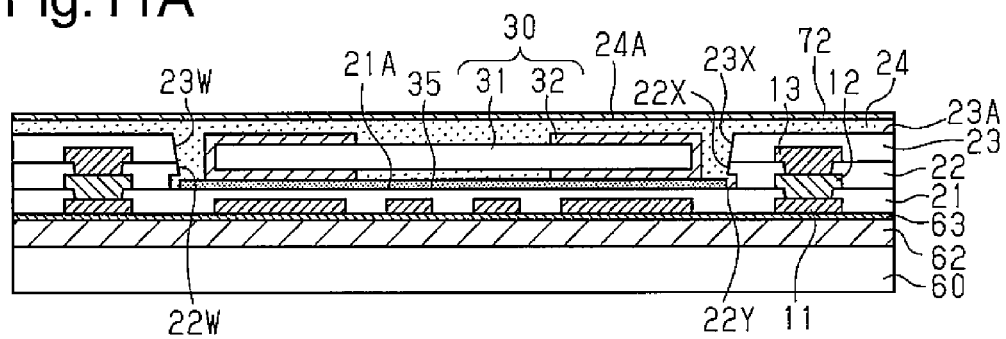

First, the same steps as the steps illustrated in FIGS. 4A to 8C are performed to manufacture the structure illustrated in FIG. 11A.

Figure 11B:
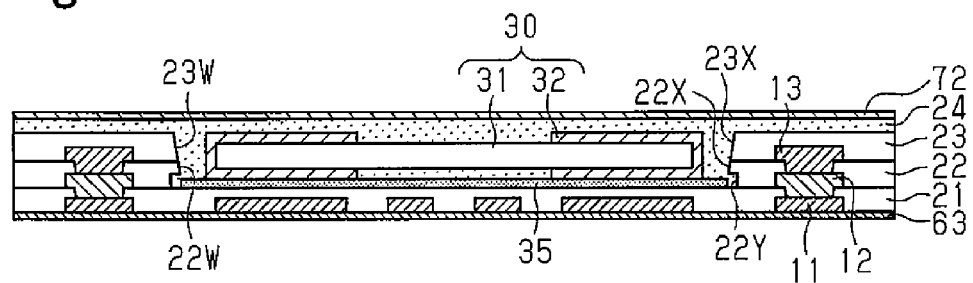

Then, the support 60 and the carrier layer 62 are removed. For example, the carrier layer 62 and the support 60 are mechanically separated from the metal foil 63. As illustrated in FIG. 11B, this exposes the lower surface of the metal foil 63 to the outside.

Figure 12A:
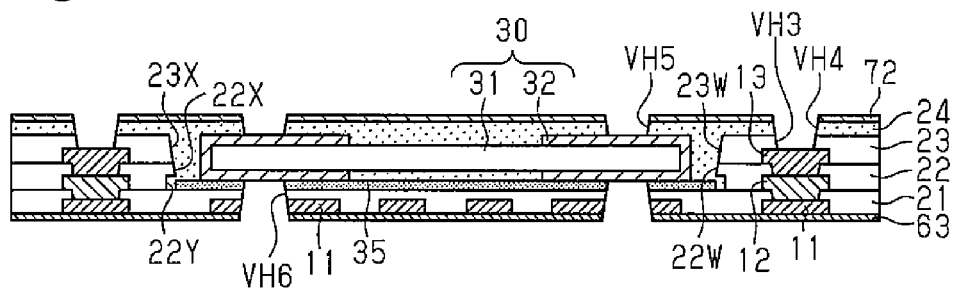

In the step illustrated in FIG. 12A, the through holes VH4 and VH5 are formed in the metal foil 72 and the insulation layer 24. Further, the through holes VH3 are formed in the insulation layer 23 in communication with the through holes VH4. The through holes VH6 are also formed extending through the metal foil 63, the wiring layer 11, the insulation layer 21, and the adhesive layer 35 in the thickness-wise direction. The through holes VH3 to VH6 may be formed through laser processing that uses a $CO_2$ laser or a YAG laser.

Figure 12B:
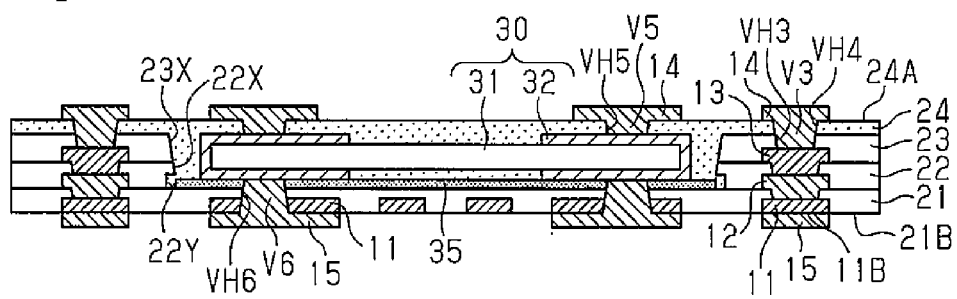
Figure 12C:
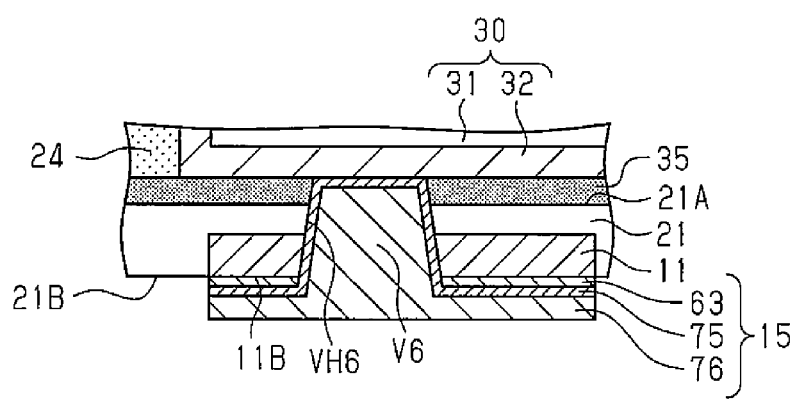

In the step illustrated in FIG. 12B, the via wirings V3 are formed in the through holes VH3 and VH4, and the via wirings V5 are formed in the through holes VH5, in the same manner as the steps illustrated in FIGS. 5B to 6B. Further, the wiring layer 14 is stacked on the upper surface 24A of the insulation layer 24. The wiring layer 14 includes the first wiring pattern (third wiring layer) which is electrically connected to the wiring layer 13 by the via wirings V3 (first via wirings), and the second wiring pattern (sixth wiring layer), which is electrically connected to the electrode terminals 32 by the via wirings V5 (fifth via wirings). In the same manner, the via wirings V6 are formed in the through holes VH6, and the wiring layer 15 is stacked on the lower surface 21B of the insulation layer 21. The wiring layer 15 is directly connected to the wiring layer 11. The wiring layer 15 includes the first wiring pattern (fifth wiring layer), which is electrically connected to the wiring layer 12 by the wiring layer 11, and the second wiring pattern (seventh wiring layer), which is electrically connected to the electrode terminals 32 by the via wirings V6 (sixth via wirings). As illustrated in FIG. 12C, the wiring layer 15 includes the metal foil 63, a seed layer 75 that covers the lower surface of the metal foil 63, and an electrolytic copper plating layer 76, which covers the lower surface of the seed layer 75. The seed layer 75 covers the lower and side surfaces of the metal foil 63; the inner wall surfaces of the wiring layer 11, the insulation layer 21, and the adhesive layer 35 that define each through hole VH6; and the lower surface of each electrode terminal 32 exposed in the corresponding through hole VH6. The through holes VH6 are filled with the electrolytic copper plating layer 76, which also covers the lower surface of the seed layer 75. The seed layer 75 may be formed from, for example, copper or a copper alloy.

In this manner, the manufacturing method of the second embodiment forms the wiring layer 15, which is electrically connected to the chip capacitor 30 and the wiring layer 11, on the surface from which the support substrate (support 60 and carrier layer 62 illustrated in FIG. 11A) is removed.

Figure 12D:
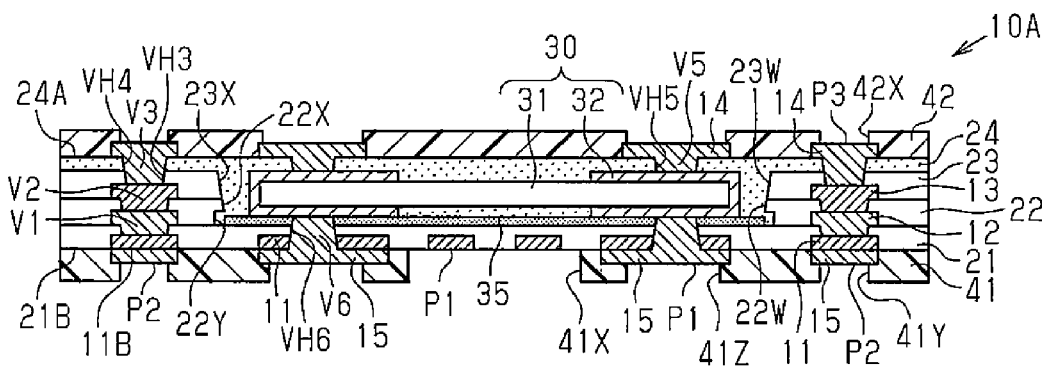

In the step illustrated in FIG. 12D, the solder resist layer 41, which includes the openings 41X, 41Y, and 41Z, is stacked on the lower surface 21B of the insulation layer 21, and the solder resist layer 42, which includes the openings 42X, is stacked on the upper surface 24A of the insulation layer 24, in the same manner as the step illustrated in FIG. 9B. The steps described above allow the wiring substrate 10A illustrated in FIG. 10A to be manufactured.

The third embodiment has the advantages described below in addition to advantages (1) to (8) of the first embodiment.

(9) The wiring layer 11 is embedded in the insulation layer 21, and the wiring layer 15 is projected downward from the lower surface 21B of the insulation layer 21. The wiring layer 11 is directly formed on the upper surface 63A of the metal foil 63, which is stacked on the support substrate including the support 60 and the carrier layer 62. Thus, the wiring layer 11 may be formed by performing, for example, a resist layer formation step, an electrolytic plating step that uses the metal foil 63 as a plating power supplying layer, and a resist layer removal step. Etching does not have to be performed to form the wiring layer 11. This allows the wiring layer 11 to be finer than when formed through steps including etching, which removes a seed layer and the like (i.e., steps illustrated in FIGS. 5B to 6B). Thus, the layout of a wiring may have high density.

The formation of the wiring layer 15 on the support substrate-removed surface, for example, allows the thickness required for the connection pads P2 to be easily obtained. In detail, when forming a connection pad P2 that is electrically connected to another wiring substrate or another semiconductor device, the connection pad P2 needs sufficient thickness to avoid solder leaching caused by an external connection terminal (solder ball or the like) bonded to the connection pad P2. The second embodiment includes the wiring layer 15 in addition to the wiring layer 11, which is a fine wiring layer. The wiring layer 15 allows the connection pads P1 and P2 to have the required thickness.

In other words, the formation of the wiring layers 11 and 15 allow the wiring layer 11 to be fine regardless of the thickness of the wiring layer 15. This allows the layout of the wiring layer 11 to have high density while obtaining the required thickness with the wiring layer 15. Accordingly, the wiring layers 11 and 15 may be efficiently laid out, and the wiring substrate 10A may entirely be reduced in size and thickness.

(10) The wiring layer 14 is electrically connected to the upper surface of the each electrode terminal 32 of the chip capacitor 30 by the via wirings V5 in the through holes VH5. Further, the wiring layer 15 is electrically connected to the lower surface of the each electrode terminal 32 by the via wirings V6 in the through holes VH6. In this manner, a via connection is arranged on both upper and lower surfaces of each electrode terminal 32 of the chip capacitor 30 in the wiring substrate 10A, which is a coreless wiring substrate. This improves the freedom of design for the wiring substrate 10A.

Third Embodiment

A third embodiment will now be described with reference to FIGS. 13 to 16C. A wiring substrate 10B of the third embodiment differs from the wiring substrate 10 of the first embodiment in the number of stacked wiring layers. The description hereafter will focus on differences from the first embodiment. Same reference numerals are given to those components that are the same as the corresponding components illustrated in FIGS. 1A to 12D. Such components will not be described in detail.

Figure 13:
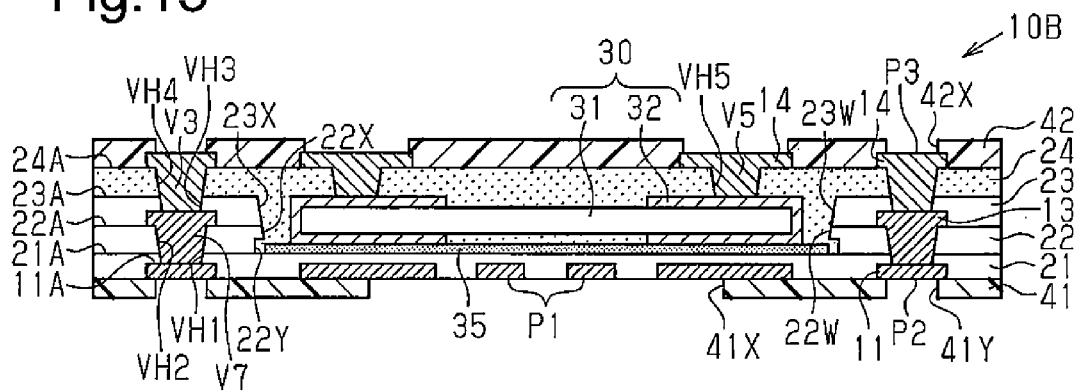
FIG. 13 is a schematic cross-sectional view illustrating a third embodiment of a wiring substrate.

As illustrated in FIG. 13, the wiring substrate 10B has a structure that sequentially stacks the wiring layer 11, the insulation layer 21, the insulation layer 22, the wiring layer 13, the insulation layer 23, the insulation layer 24, and the wiring layer 14. Further, the wiring substrate 10B includes the chip capacitor 30, the solder resist layer 41, and the solder resist layer 42. The chip capacitor 30 is incorporated in the insulation layers 21 to 24.

The adhesive layer 35 is formed on the upper surface 21A of the insulation layer 21. The upper surface 21A of the insulation layer 21 is free from a wiring layer. The through holes VH1 extend through the insulation layer 21 in the thickness-wise direction at given locations and partially expose the upper surface 11A of the wiring layer 11.

The insulation layer 22 is stacked on the upper surface 21A of the insulation layer 21. The upper surface 22A of the insulation layer 22 is located at a lower position than the upper surface of each electrode terminal 32 of the chip capacitor 30. The thickness of the insulation layer 22 from the upper surface 21A of the insulation layer 21 to the upper surface 22A of the insulation layer 22 may be, for example, approximately 40 to 60 µm.

The through holes VH2 extend through the insulation layer 22 in the thickness-wise direction at given locations and partially expose the upper surface 11A of the wiring layer 11. The through holes VH2 of the insulation layer 22 are in communication with the through holes VH1 of the insulation layer 21. In the present example, the wall surfaces of the insulation layer 21 defining the through holes VH1 are continuous with the wall surfaces of the insulation layer 22 defining the through holes VH2. Each of the through holes VH1 and VH2 is, for example, tapered so that the diameter decreases, as viewed in FIG. 13, from the upper side toward the lower side. Each of the through holes VH1 and VH2 has the shape of a generally inverted truncated cone in which the diameter of the lower opening end is smaller than that of the upper opening end.

The wiring layer 13 is stacked on the upper surface 22A of the insulation layer 22. The through holes VH1 and VH2 are filled with via wirings V7 (fourth via wirings) that electrically connect the wiring layer 13 to the wiring layer 11. The wiring layer 13 is, for example, formed integrally with the via wirings VT.

The insulation layer 23 is formed on the upper surface 22A of the insulation layer 22 and covers the wiring layer 13. The upper surface 23A of the insulation layer 23 lies along the same plane as the upper surface of each electrode terminal 32 of the chip capacitor 30, which is incorporated in the insulation layers 21 to 24, or is located upward from the upper surface of each electrode terminal 32. The insulation layer 23 has a thickness measured from the upper surface of the wiring layer 13 to the upper surface 23A of the insulation layer 23 that may be set to, for example, approximately 20 to 40 µm.

A method for manufacturing the wiring substrate 10B will now be described. To aid understanding, components that ultimately function as the elements of the wiring substrate 10B are denoted by the reference characters added to such elements.

Figure 14A:
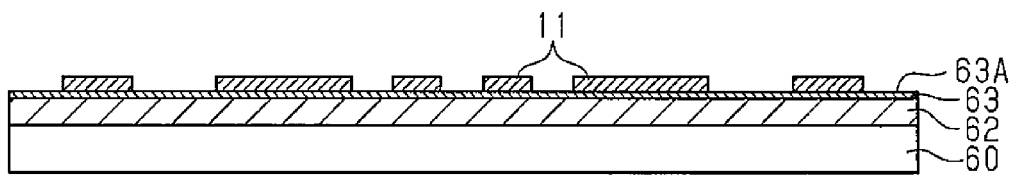
FIGS. 14A to 14C, 15A to 15D, and 16A to 16C are schematic cross-sectional views illustrating a method for manufacturing the wiring substrate of FIG. 13.
Figure 14B:
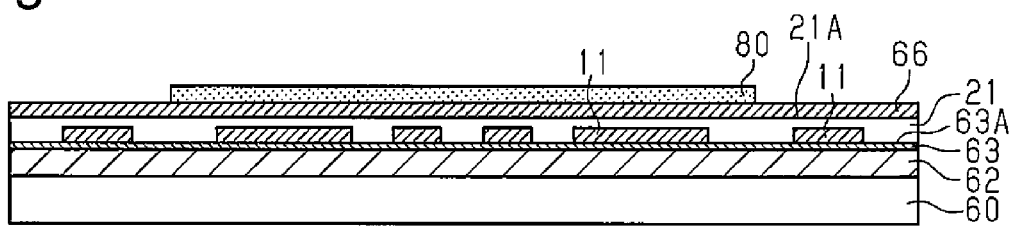

First, the same steps as the steps illustrated in FIGS. 4A and 4B are performed to manufacture the structure illustrated in FIG. 14A. In the step illustrated in FIG. 14B, the insulation layer 21, which entirely covers the wiring layer 11, is stacked on the upper surface 63A of the metal foil 63, and the metal foil 66, which entirely covers the wiring layer 11, is formed on the upper surface 21A of the insulation layer 21, in the same manner as the steps illustrated in FIGS. 4C and 4D. Then, a. resist layer 80, which has a given pattern, is formed on the metal foil 66. The resist layer 80, which is located in the mounting region of the chip capacitor 30 (refer to FIG. 13), is larger than the openings 22X and 23X (refer to FIG. 13) in a plan view. The resist layer 80 may be formed from a material that is resistant to etching in the following etching process. For example, the resist layer 80 may be a photosensitive dry film resist or a photoresist liquid. Such a material of the resist layer 80 may be, for example, a novolac resin or an acrylic resin.

Figure 14C:
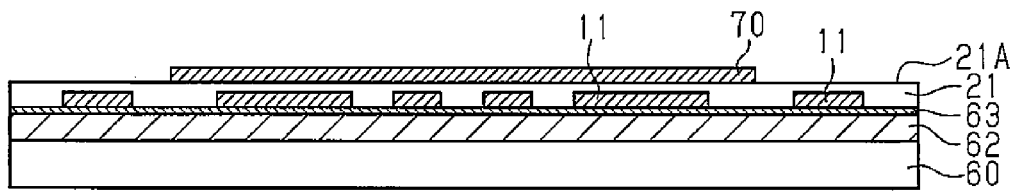

Then, etching is performed to remove the metal foil 66 using the resist layer 80 as an etching mask. As illustrated in FIG. 14C, this forms the metal layer 70 in the mounting region of the chip capacitor 30 (refer to FIG. 13). In this case, only the metal layer 70 is formed on the upper surface 21A of the insulation layer 21. Wiring layers are not formed on the upper surface 21A of the insulation layer 21. Then, for example, an alkaline defoliation liquid is used to remove the resist layer 80 illustrated in FIG. 14B.

Figure 15A:
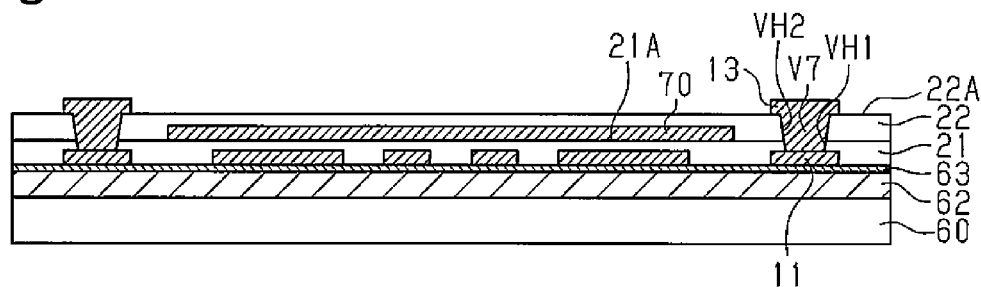

In the step illustrated in FIG. 15A, the insulation layer 22, which entirely covers the metal layer 70, is formed on the upper surface 21A of the insulation layer 21 in the same manner as the steps illustrated in FIGS. 4C to 5A. Further, the through holes VH2 are formed in the insulation layer 22, and the through holes VH1 are formed in the insulation layer 21. Then, the through holes VH1 and VH2 are filled with the via wirings V7 (fourth via wirings) in the same manner as the steps illustrated in FIGS. 5B to 6B. Further, the wiring layer 13, which is electrically connected to the wiring layer 11 by the via wirings V7, is stacked on the upper surface 22A of the insulation layer 22.

Figure 15B:
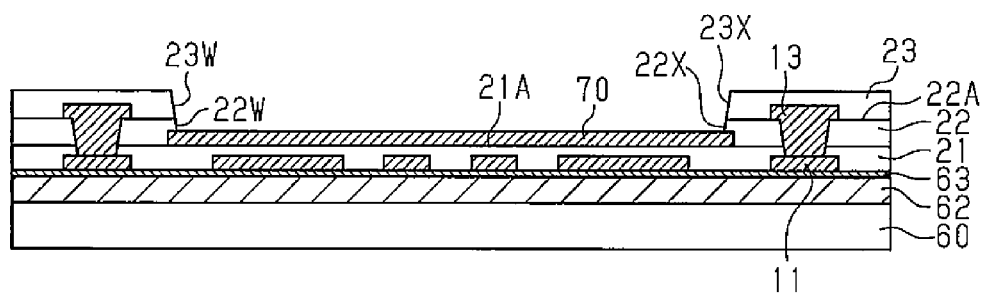

In the step illustrated in FIG. 15B, the insulation layer 23, which entirely covers the wiring layer 13, is formed on the upper surface 22A of the insulation layer 22 in the same manner as the step illustrated in FIG. 7A. Then, the openings 22X and 23X are formed extending in the thickness-wise direction through the insulation layers 22 and 23 in the same manner as the step illustrated in FIG. 7B.

Figure 15C:
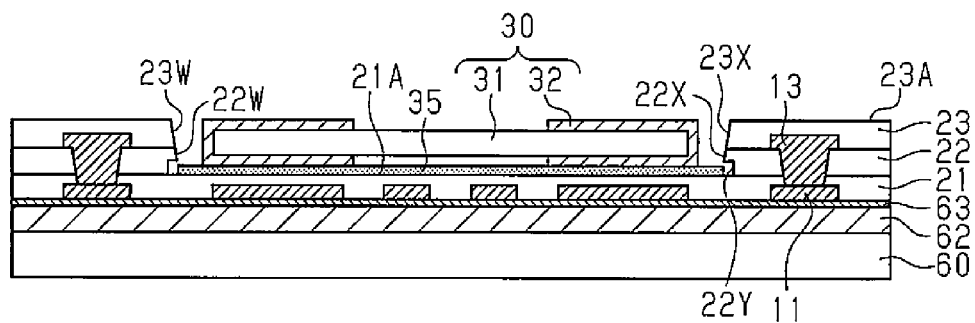

Then, in the same manner as the step illustrated in FIG. 7C, isotropic etching is performed using the insulation layers 22 and 23 as an etching mask to remove the metal layer 70. Consequently, as illustrated in FIG. 15C, the recess 22Y is formed below the opening 22X by the lower portion of the stepped inner wall surface 22W of the insulation layer 22.

Then, in the same manner as the steps illustrated in FIGS. 8A and 8B, the chip capacitor 30 is mounted on the upper surface 21A of the insulation layer 21 exposed in the openings 22X and 23X with the adhesive layer 35 arranged in between.

Figure 15D:
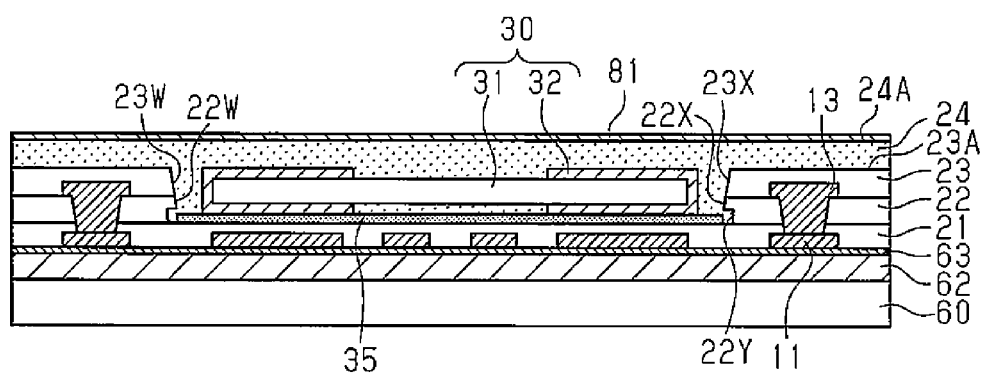

In the step illustrated in FIG. 15D, the insulation layer 24, which entirely covers the upper surface 23A of the insulation layer 23 and with which the openings 22X and 23X and the recess 22Y are filled, and a metal foil 81, which entirely covers the upper surface 24A of the insulation layer 24, are sequentially stacked on the upper surface 23A of the insulation layer 23 in the same manner as the steps illustrated in FIG. 8C. The insulation layer 24 entirely covers the surfaces of the chip capacitor 30 that are not in contact with the adhesive layer 35.

Then, etching is performed to remove the metal foil 81. In the step illustrated in FIG. 16A, the through holes VH3 and VH4 are filled with the via wirings V3 (first via wirings), and the through holes VH5 are filled with the via wirings V5 (fifth via wirings), in the same manner as the step illustrated in FIG. 8D. Further, the wiring layer 14 is stacked on the upper surface 24A of the insulation layer 24. The wiring layer 14 includes the first wiring pattern (third wiring layer), which is electrically connected to the wiring layer 13 by the via wirings V3, and the second wiring pattern (sixth wiring layer), which is electrically connected to the electrode terminals 32 by the via wirings V5.

Figure 16A:
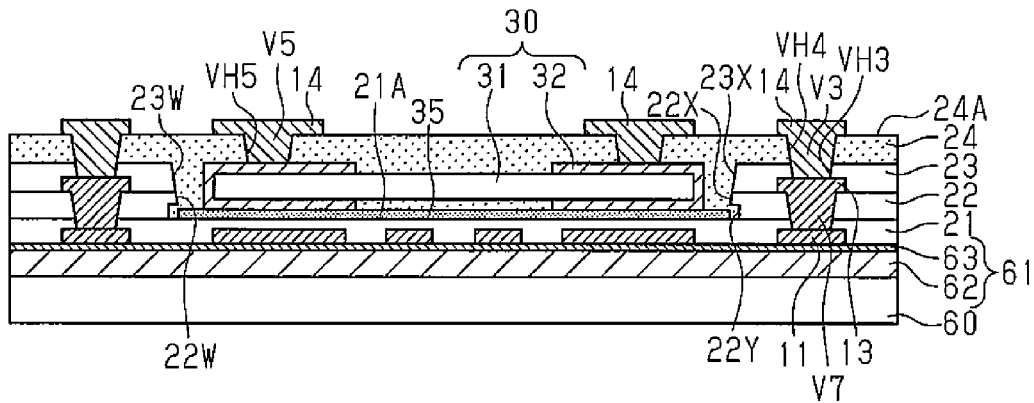
Figure 16B:
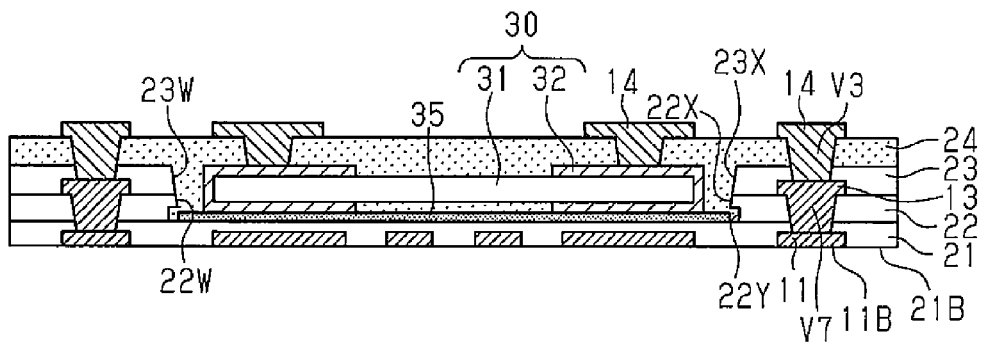

Then, in the same manner as the step illustrated in FIG. 9A, the support 60 and the carrier-added metal foil 61 (carrier layer 62 and metal foil 63) are removed. As illustrated in FIG. 16B, this exposes the lower surface lib of the wiring layer 11 and the lower surface 21B of the insulation layer 21 to the outside.

Figure 16C:
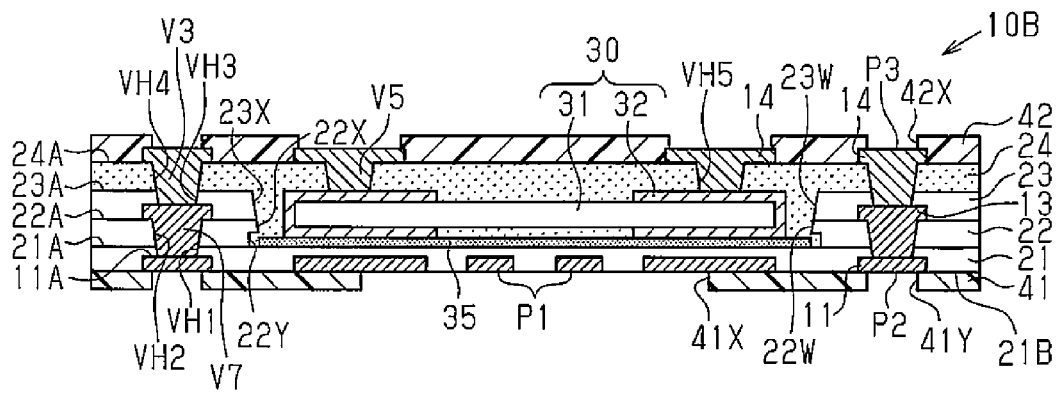

In the step illustrated in FIG. 16C, the solder resist layer 41, which includes the openings 41X and 41Y, is stacked on the lower surface 21B of the insulation layer 21, and the solder resist layer 42, which includes the openings 42X, is stacked on the upper surface 24A of the insulation layer 24, in the same manner as the step illustrated in FIG. 9B. The steps described above allow the wiring substrate 10B illustrated in FIG. 13 to be manufactured.

The third embodiment has the same advantages as the first embodiment.

Fourth Embodiment

A fourth embodiment will now be described with reference to FIGS. 17A to 17D. A wiring substrate 10C of the fourth embodiment differs from the wiring substrate 10B of the third embodiment in that the wiring layer 15 is stacked on the chip mounting surface. Same reference numerals are given to those components that are the same as the corresponding components illustrated in FIGS. 1A to 16C. Such components will not be described in detail.

A method for manufacturing the wiring substrate 10C illustrated in FIG. 17D will now be described.

Figure 17A:
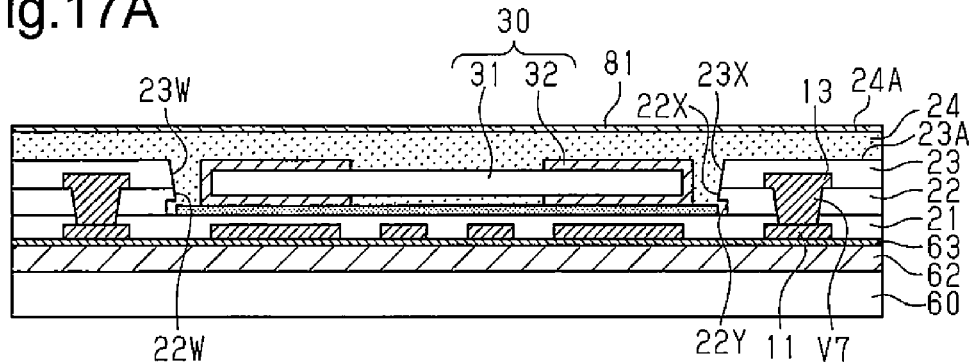
FIGS. 17A to 17D are schematic cross-sectional views illustrating a method for manufacturing a fourth embodiment of a wiring substrate.

The same steps as the steps illustrated in FIGS. 14A to 15D are performed to manufacture the structure illustrated in FIG. 17A.

Figure 17B:
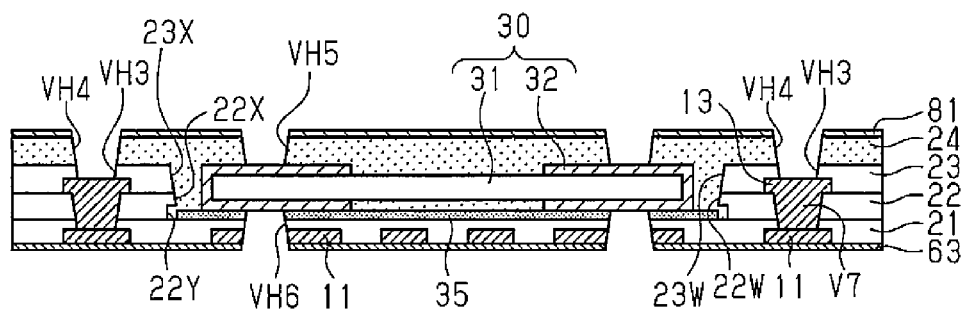

Then, the support 60 and the carrier layer 62 are removed. This exposes the lower surface of the metal foil 63 to the outside. Then, as illustrated in FIG. 17B, laser processing is performed to form the through holes VH4 and VH5, which extend through the metal foil 81 and the insulation layer 24, and the through holes VH3, which extend through the insulation layer 23 and are in communication with the through holes VH4. Further, laser processing is performed to form the through holes VH6 that extend through the metal foil 63, the wiring layer 11, the insulation layer 21, and the adhesive layer 35 in the thickness-wise direction.

Figure 17C:
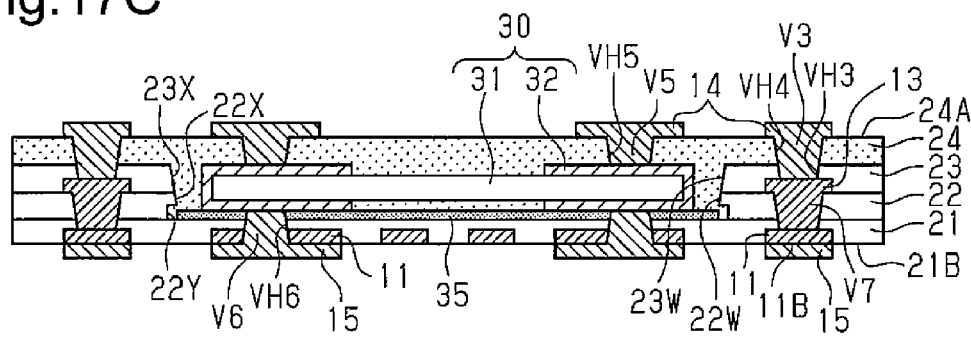

In the step illustrated in FIG. 17C, the through holes VH3 and VH4 are filled with the via wirings V3 (first via wirings), and the through holes VH5 are filled with the via wirings V5 (fifth via wirings), in the same manner as the step illustrated in FIG. 8D. Further, the wiring layer 14 is stacked on the upper surface 24A of the insulation layer 24. The wiring layer 14 includes the first wiring pattern (third wiring layer), which is electrically connected to the wiring layer 13 by the via wirings V3, and the second wiring pattern (sixth wiring layer), which is electrically connected to the electrode terminals 32 by the via wirings VS. In the same manner, the through holes VH6 are filled with the via wirings V6 (sixth via wirings), and the wiring layer 15 is stacked on the lower surface 21B of the insulation layer 21. The wiring layer 15 includes the first wiring pattern (fifth wiring layer), which is electrically connected to the wiring layer 13 by the wiring layer 11, and the second wiring pattern (seventh wiring layer), which is electrically connected to the electrode terminals 32 by the via wirings V6 (sixth via wirings).

Figure 17D:
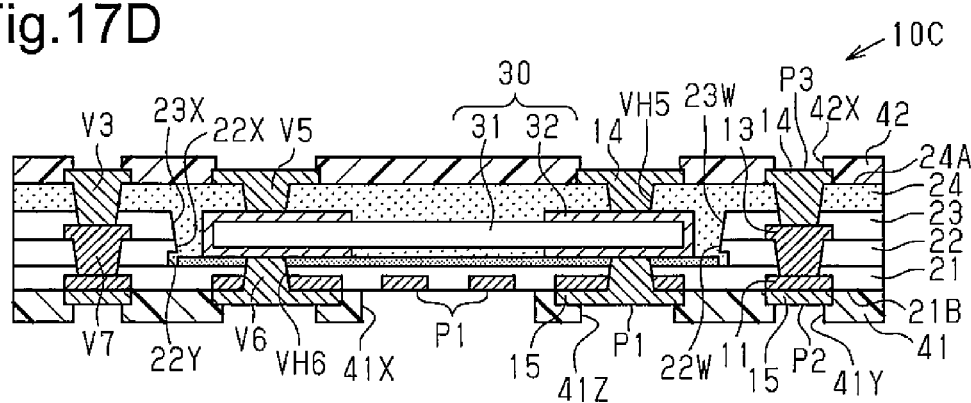

In the step illustrated in FIG. 17D, the solder resist layer 41, which includes the openings 41X, 41Y, and 41Z, is stacked on the lower surface 21B of the insulation layer 21, and the solder resist layer 42, which includes the openings 42X, is stacked on the upper surface 24A of the insulation layer 24, in the same manner as the step illustrated in FIG. 9B.

The steps described above allow the wiring substrate 10C of the fourth embodiment to be manufactured. In the wiring substrate 10C, the wiring layer 15 is directly stacked on the lower surface 11B of the wiring layer 11 and directly connected to the wiring layer 11.

The fourth embodiment has the same advantages as the first and second embodiments.

It should be apparent to those skilled in the art that the foregoing embodiments may be employed in many other specific forms without departing from the scope of the invention. Particularly, it should be understood that the foregoing embodiments may be employed in the following forms.

In the second and fourth embodiments, the through holes VH5 and the via wirings V5 arranged in the through holes VH5 may be omitted.

Figure 18:
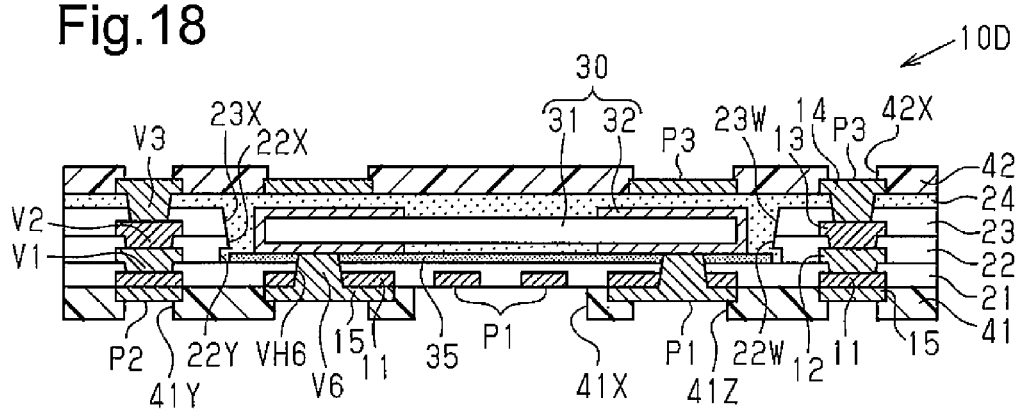
FIG. 18 is a schematic cross-sectional view illustrating a modified example of a wiring substrate.

For example, as illustrated in FIG. 18, the through holes VH5 and the via wirings V5 arranged in the through holes VH5 may be omitted from the structure of the wiring substrate 10A of the second embodiment (refer to FIG. 10A). Thus, a wiring substrate 10D illustrated in FIG. 18 does not include via wirings that connect the wiring layer 14, which is located on the external connection terminal surface, and the chip capacitor 30. The wiring substrate 10D includes only the via wirings V6 that connect the wiring layer 15, which is located on the chip mounting surface, and the chip capacitor 30. That is, in the wiring substrate 10D, only the lower surface of the electrode terminals 32 of the chip capacitor 30 are connected to the via wires V6. The wiring substrate 10C of the fourth embodiment may be modified in the same manner.

In the above embodiments and modified example, there is no limit to the number of chip capacitors 30 incorporated in the wiring substrates 10 and 10A to 10D.

Figure 19:
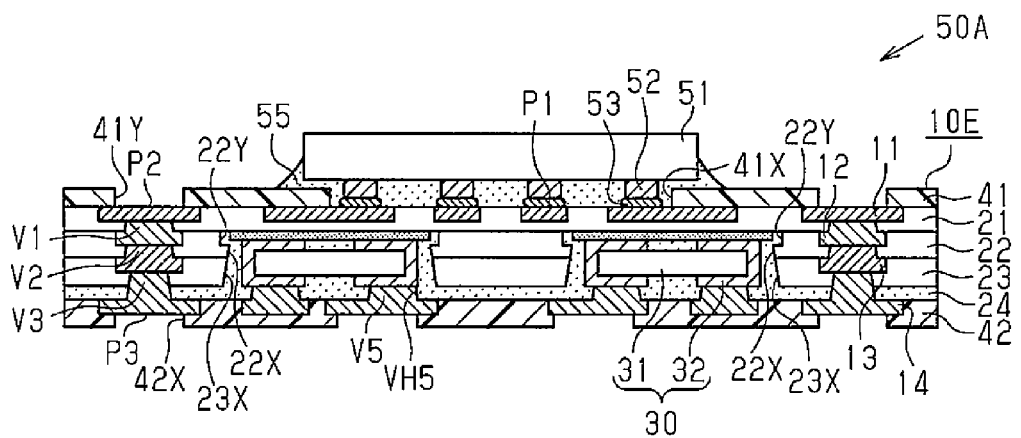
FIG. 19 is a schematic cross-sectional view illustrating a modified example of a semiconductor device.

For example, as illustrated in FIG. 19, a plurality of (here, two) chip capacitors 30 may be incorporated in a wiring substrate 10E. The wiring substrate 10E is formed by incorporating two chip capacitors 30 in the wiring substrate 10 illustrated in FIG. 1A. The number of the openings 22X and 23X in the insulation layers 22 and 23 of the wiring substrate 10E is the same as the number of the chip capacitors 30. In this case, the number is two.

Figure 20:
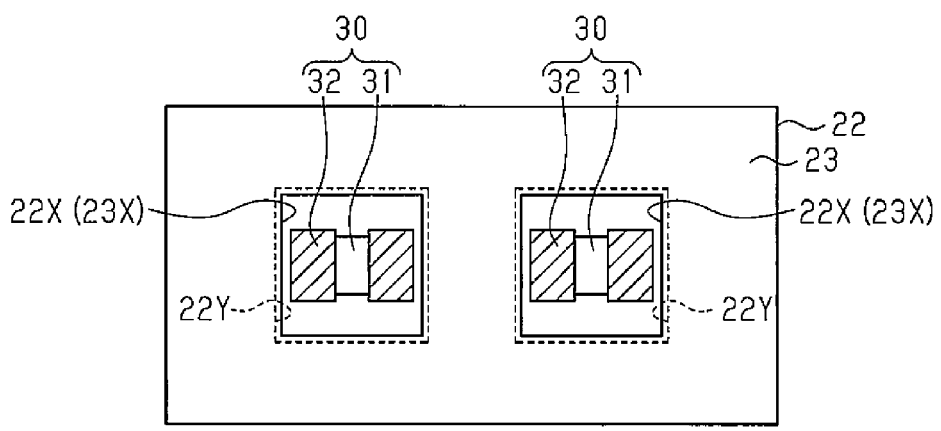
FIG. 20 is a schematic plan view illustrating a wiring substrate illustrated in FIG. 19.

For example, as illustrated in FIG. 20, the two openings 22X are independent from each other. In the same manner, the two openings 23X are independent from each other. Each of the openings 22X and 23X is tetragonal in a plan view. Each chip capacitor 30 is arranged in a corresponding one of the openings 22X and 23X. As illustrated in FIG. 19, the via wirings V5 in the through holes VH5 electrically connect the electrode terminals 32 of each chip capacitor 30 to the wiring layer 14.

The wiring substrates 10A to 10D may be modified in the same manner as the modified example of the wiring substrate 10.

In the modified example illustrated in FIGS. 19 and 20, the number of incorporated chip capacitors 30 is the same as the number of the openings 22X and 23X. However, a plurality of chip capacitors 30 may be arranged in each of the openings 22X and 23X.

In each of the above embodiments and modified examples, the recess 22Y may be omitted.

In each of the above embodiments and modified examples, the wiring substrates 10 and 10A to 10E incorporate the chip capacitor 30, which includes the two electrode terminals 32. Instead, the wiring substrates 10 and 10A to 10 may incorporate a chip capacitor 30 that includes three or more electrode terminals 32.

In each of the above embodiments and modified examples, the wiring substrates 10 and 10A to 10E incorporate the chip capacitor 30. However, the electronic component is not limited to the chip capacitor 30. For example, the incorporated electronic component may be a chip resistor, an inductor, or a semiconductor device (LSI). Further, the electronic component incorporated in the wiring substrates 10 and 10A to 10E is not limited to one type and may be more than one type.

In the above embodiments and modified examples, the number of semiconductor chips 51 mounted on the wiring substrates 10 and 10E of the semiconductor devices 50 and 50A and the mounting mode of the semiconductor chip 51 (e.g., flip-chip mounting, wire bonding mounting, or a combination of flip-chip mounting and wire bonding mounting) may be changed.

In each of the above embodiments and modified examples, the semiconductor chip 51 may be mounted on the wiring substrates 10A to 10D.

The wiring substrates 10 and 10A to 10E of the above embodiments include the two insulation layers 22 and 23 used to form a cavity but may instead include three or more layers to form a cavity.

In the wiring substrates 10 and 10A to 10E of each of the above embodiments and modified examples, there is particularly no limit to the number of wiring layers and insulation layers stacked on the upper surface 24A of the insulation layer 24, with which the cavity is filled. For example, the wiring layer 14, an insulation layer that covers the wiring layer 14, and a wiring layer stacked on the insulation layer may be sequentially stacked on the upper surface 24A of the insulation layer 24.

In the wiring substrates 10 and 10A to 10E of each of the above embodiments and modified examples, there is particularly no limit to the number of wiring layers and insulation layers stacked on the lower surface of the insulation layer 22, which is used to form the cavity. For example, after alternately forming a plurality of wiring layers and a plurality of insulation layers one after another on the upper surface 21A of the insulation layer 21, the insulation layers 22 and 23 may be stacked to form the cavity. In other words, in each of the above embodiments and modified examples, "the first insulation layer" includes only the single insulation layer 21 but may include a plurality of insulation layers.

In each of the above embodiments, a coreless wiring substrate is manufactured by mainly using the build-up process to stack a wiring layer and an insulation layer on one surface (either one of upper surface and lower surface) of the support substrate and finally removing the support substrate. Instead, for example, a plurality of coreless wiring substrates may be manufactured by arranging the carrier-added metal foil 61 on both surfaces (both upper and lower surfaces) of a support substrate, mainly using the build-up process to stack a wiring layer and an insulation layer on the two sides (one surface and other surface) of the support substrate, and finally removing the support substrate. In this case, the wiring layer and the insulation layer may be sequentially stacked on each of the upper and lower surfaces of the support substrate from the chip-mounting surface in the same manner as, for example, the steps illustrated in FIGS. 4A to 8D. Although this is a modified example of the first embodiment, the second to fourth embodiment may be modified in the same manner.

The manufacturing method of the wiring substrates 10 and 10A to 10D in the above embodiments uses a support substrate that includes the support 60 and the carrier-added metal foil 61 (carrier layer 62 and metal foil 63). Instead, for example, the carrier-added metal foil 61 may be omitted, and the support substrate may include only the support 60.

In the manufacturing method of the wiring substrates 10 and 10A to 10D of the above embodiments, the metal foils 63, 66, 71, 72, and 81 may be omitted.

In each of the above embodiments, a single wiring substrate is manufactured. However, the above embodiments may be applied when manufacturing a plurality of wiring substrates.

In the wiring substrates 10 and 10A to 10E of each of the above embodiments and modified examples, the surface on the side where the pads P1 are formed defines the chip mounting surface, and the surface on the side the external connection pads P3 are formed defines the external connection terminal surface. Instead, for example, the surface on the side where the pads P1 are formed may define the external connection terminal surface, and the surface on the side where the external connection terminal pads P3 are formed may define the chip mounting surface.

The wiring substrates 10 and 10A to 10E of the above embodiments and modified examples each have the structure of a coreless wireless substrate. Instead, for example, the wiring substrates 10 and 10A to 10E may each have the structure of a build-up wiring substrate. One example of a build-up wiring substrate will now be described.

Figure 21:
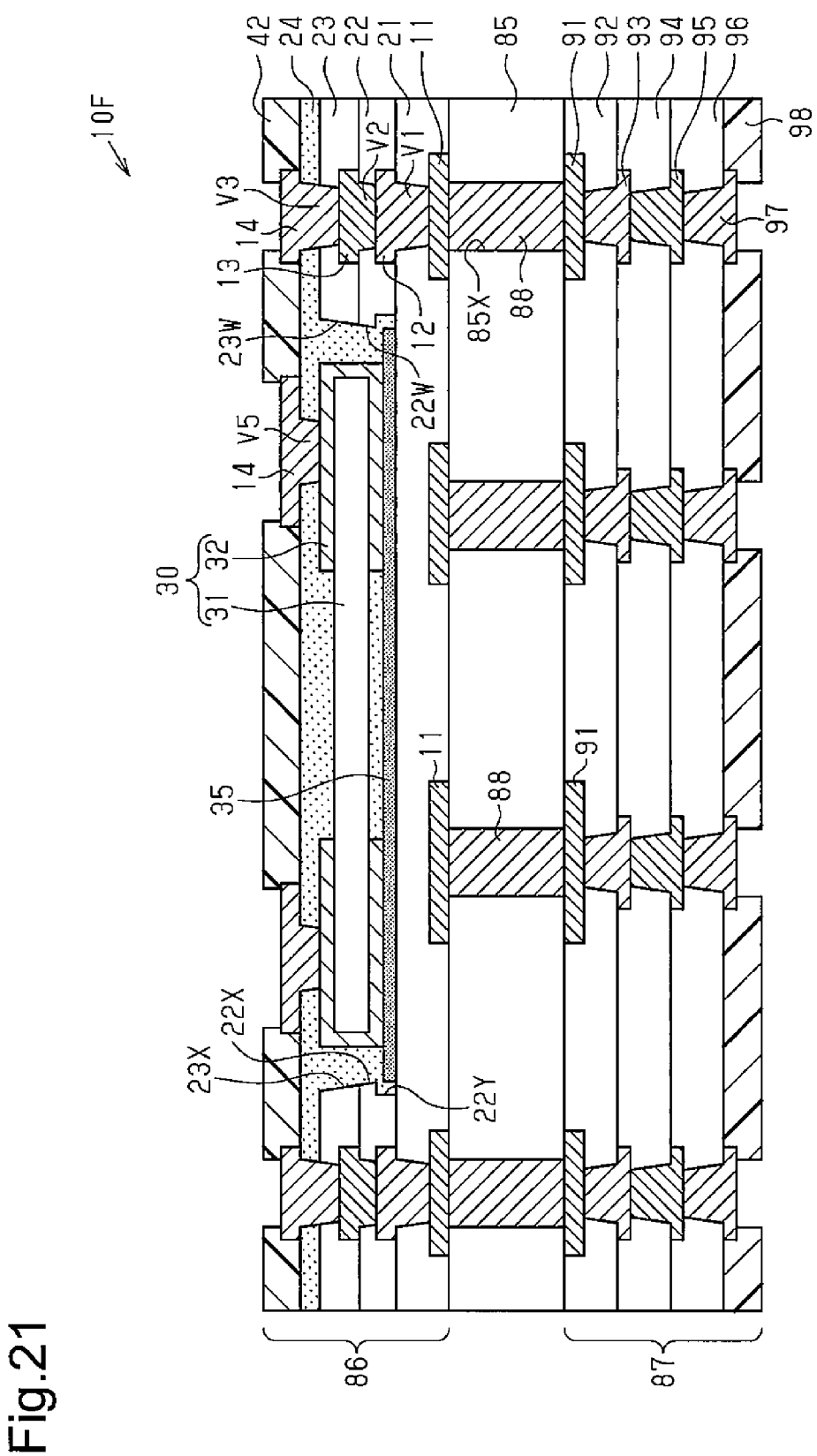
FIG. 21 is a schematic cross-sectional view illustrating a further modified example of a wiring substrate.

In the example illustrated in FIG. 21, a wiring substrate 10F includes a core substrate 85, a wiring structure 86 stacked on the upper surface of the core substrate 85, and a wiring structure 87 stacked on the lower surface of the core substrate 85. The core substrate 85 is, for example, a glass epoxy substrate. The glass epoxy substrate may be formed by, for example, impregnating a glass cloth (glass woven cloth), which is a reinforcement material, with a thermosetting insulative resin, the main component of which is an epoxy resin, and hardening the resin. The reinforcement material is not limited to a glass cloth and may be, for example, a glass non-woven cloth, an aramid woven cloth, an aramid non-woven cloth, an LCR woven cloth, or an LCP non-woven cloth. Further, the thermosetting insulative resin is not limited to an epoxy resin and may be, for example, a polyimide resin or a cyanate resin. The core substrate 85 is thicker than the other insulation layers. The core substrate 85 may have a thickness of, for example, approximately, 40 to 400 μm.

The core substrate 85 includes through holes 85X at given locations (four locations in FIG. 21). A through electrode 88 is formed in each through hole 85X. For example, the through hole 88 is filled with the through electrode 88.

The wiring structure 86 has, for example, the same structure as the wiring substrate 10 of the first embodiment (refer to FIG. 1A). Accordingly, the wiring structure 86 includes the wiring layer 11, which is electrically connected to the through electrodes 88, the insulation layer 21, the wiring layer 12, the insulation layer 22, the wiring layer 13, the insulation layer 23, the insulation layer 24, the wiring layer 14, and the solder resist layer 42. These layers are sequentially stacked on the upper surface of the core substrate 85. Further, the chip capacitor 30 is incorporated in the wiring structure 86.

The wiring structure 87 includes a wiring layer 91, an insulation layer 92, a wiring layer 93, an insulation layer 94, a wiring layer 95, an insulation layer 96, a wiring layer 97, and a solder resist layer 98. These layers are sequentially stacked on the lower surface of the core substrate 85. The wiring layers 91, 93, 95, and 97 may be formed from, for example, copper or a copper alloy. The insulation layers 92, 94, and 96 may be formed from, for example, the same material as the insulation layers 21 to 24. The solder resist layer 98 may be formed from, for example, the same material as the solder resist layer 42.

The through electrodes 88 electrically connect the wiring layer 91 to the wiring layer 11. Via wirings extending through the insulation layer 92 in the thickness-wise direction electrically connect the wiring layer 93 to the wiring layer 91. Via wirings extending through the insulation layer 94 in the thickness-wise direction electrically connect the wiring layer 95 to the wiring layer 93. Via wirings extending through the insulation layer 96 in the thickness-wise direction electrically connect the wiring layer 97 to the wiring layer 95.

The wiring substrate 10F also has advantages (1) to (7) of the first embodiment. Although this is a modified example of the wiring substrate 10, the wiring substrate 10B may be modified in the same manner.

Figure 22:
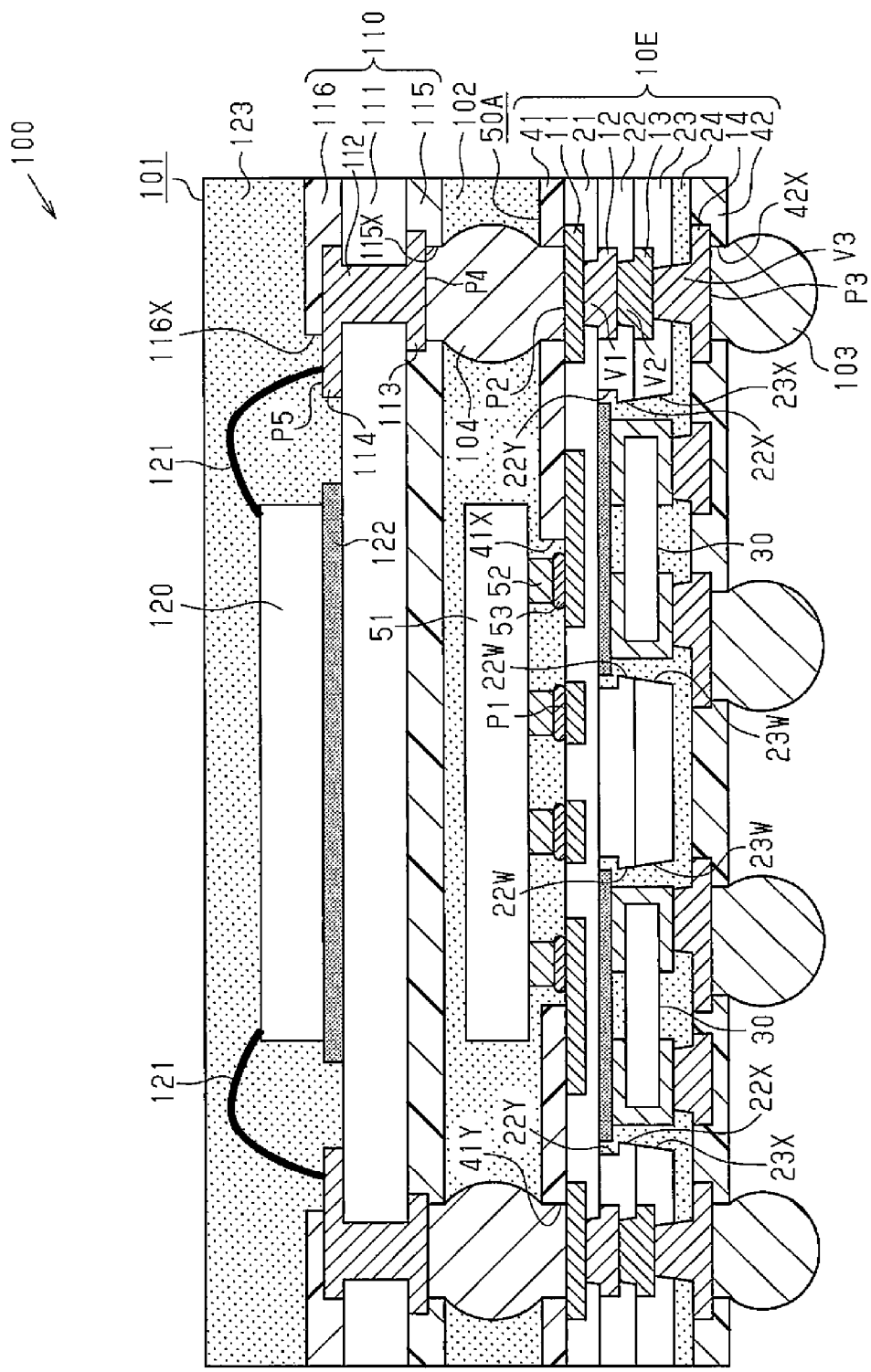
FIG. 22 is a schematic cross-sectional view illustrating an example to which the wiring substrate of FIG. 20 is applied.

With reference to FIG. 22, an example of an application of the wiring substrate 10E will now be described. A semiconductor device 100 that includes a semiconductor package 101 in addition to the wiring substrate 10E will be described.

The semiconductor device 100 includes the wiring substrate 10E, the semiconductor chip 51 mounted on the wiring substrate 10E, and the semiconductor package 101 stacked on and bonded to the wiring substrate 10E. The semiconductor device 100 includes an encapsulation resin 102, which is formed in a gap between the wiring substrate 10E and a wiring substrate 110 of the semiconductor package 101, and external connection terminals 103.

One example of the structure of the semiconductor package 101 will now be described.

The semiconductor package 101 includes the wiring substrate 110, at least one (here, one). semiconductor chip 120 mounted on the wiring substrate 110, bonding wires 121 electrically connecting the semiconductor chip 120 and the wiring substrate 110, and an encapsulation resin 123 that encapsulates the semiconductor chip 120 and the like.

The wiring substrate 110 includes a core substrate 111, through electrodes 112 extending through the core substrate 111, a lowermost wiring layer 113 formed on the lower surface of the core substrate 111, an uppermost wiring layer 114 formed on the upper surface of the core substrate 111, and solder resist layers 115 and 116. The through electrodes 112 electrically connect the wiring layers 113 and 114 to each other.

The solder resist layer 115 is stacked on the lower surface of the core substrate 111 to partially cover the wiring layer 113. The solder resist layer 115 includes openings 115X that expose portions of the wiring layer 113 as connection pads P4. The connection pads P4 face the connection pads P2 of the wiring substrate 10E and are electrically connected to the connection pads P2.

The solder resist layer 116 is stacked on the upper surface of the core substrate 111 to partially cover the wiring layer 114. The solder resist layer 116 includes an opening 116X exposing portions of the wiring layer 114 as pads P5. The pads P5 function as electronic component mounting pads electrically connected to an electronic component such as a semiconductor chip or a passive element.

The wiring substrate 110 is not limited to a wiring substrate that includes the core substrate 111 and may be a coreless wiring substrate that does not include the core substrate 111.

The semiconductor chip 120 is wire-bonded to the wiring substrate 110. In the present example, the semiconductor chip 120 is adhered to the upper surface of the core substrate 111 by an adhesive layer 122. The bonding wires 121 electrically connect electrodes (not illustrated) of the semiconductor chip 120 to the pads P5. The mounting mode of the semiconductor chip 120 is not particularly limited. For example, the semiconductor chip 120 may be flip-chip mounted on the wiring substrate 110.

The encapsulation resin 123 is formed on the upper surface of the wiring substrate 110 to encapsulate the semiconductor chip 120 and the bonding wires 121.

Solder balls 104 are bonded to the connection pads P2 of the wiring substrate 10E and the connection pads P4 of the wiring substrate 110. The solder balls 104 are located between the wiring substrate 10E and the semiconductor package 101. Each solder ball 104 may be, for example, a conductive core ball (copper core ball) or a solder ball having a structure in which a resin core ball is covered with solder. The solder ball 104 does not have to include a core ball (conductive core ball or resin core ball).

In this manner, the solder balls 104 bond the wiring substrate 10E and the semiconductor package 101 to form the semiconductor device 100 that has a package on package (POP) structure.

The gap between the wiring substrate 10E and the wiring substrate 110 is filled with the encapsulation resin 102. The encapsulation resin 102 fixes the wiring substrate 110 to the wiring substrate 10E and encapsulates the semiconductor chip 51, which is mounted on the wiring substrate 10E. Accordingly, the encapsulation resin 102 functions as an adhesive that adheres the wiring substrate 10E and the wiring substrate 110 and as a protective layer that protects the semiconductor chip 51.

The external connection terminals 103 are formed on the external connection pads P3 of the wiring substrate 10E. The external connection terminals 103 are electrically connected to pads on a mounting substrate such as a motherboard (not illustrated). The external connection terminals 103 may be, for example, solder balls or lead pins.

An example of an application of the wiring substrate 10E has been described. Instead of the wiring substrate 10E, the wiring substrates 10, 10A to 10D, and 10F may be applied to the structure of FIG. 22 in the same manner.

CLAUSES

This disclosure encompasses the following embodiments.

1. A method for manufacturing a wiring substrate, the method including:
  forming a first wiring layer;
  stacking a first insulation layer on the first wiring layer;
  forming a second insulation layer on an upper surface of the first insulation layer;
  forming a second wiring layer, which is electrically connected to the first wiring layer, on an upper surface of the second insulation layer;
  forming a third insulation layer, which covers the second wiring layer, on the upper surface of the second insulation layer;
  forming a cavity that extends through the second insulation layer and the third insulation layer in a thickness-wise direction;
  mounting an electronic component on the upper surface of the first insulation layer exposed in the cavity;
  forming a fourth insulation layer that entirely covers an upper surface of the third insulation layer and the electronic component, wherein the cavity is filled with the fourth insulation layer;
  forming a first via wiring, which extends through the fourth insulation layer and the third insulation layer, on an upper surface of the fourth insulation layer; and
  forming a third wiring layer that is electrically connected to the second wiring layer by the first via wiring.

2. The method according to clause 1, further including:
  forming a second via wiring, which extends through the first insulation layer in the thickness-wise direction, on the upper surface of the first insulation layer; and
  forming a fourth wiring layer that is electrically connected to the first wiring layer by the second via wiring,
  wherein the forming a second insulation layer includes forming the second insulation layer that covers the fourth wiring layer, and
  the forming a second wiring layer includes
  forming a third via wiring that extends through the second insulation layer, and
  forming the second wiring layer that is electrically connected to the fourth wiring layer by the third via wiring.

3. The method according to clause it wherein the forming a second wiring includes
  forming a fourth via wiring that extends through the first insulation layer and the second insulation layer, and
  forming the second wiring layer that is electrically connected to the first wiring layer by the fourth via wiring.

4. The method according to any one of clauses 1 to 3, wherein
  the forming a first wiring layer includes forming the first wiring layer on an upper surface of a support substrate, and
  the forming a first insulation layer includes forming the first insulation layer that covers an upper surface and a side surface of the first wiring layer on the upper surface of the support substrate,
  the method further including:
  removing the support substrate after forming the fourth insulation layer;
  forming a first through hole that extends through the fourth insulation layer and exposes an upper portion of the electronic component;
  forming a second through hole that extends through the first insulation layer and exposes a lower portion of the electronic component;
  filling the first through hole with a fifth via wiring;
  filling the second through hole with a sixth via wiring;
  forming a sixth wiring layer, which is electrically connected to the electronic component by the fifth via wiring, on the upper surface of the fourth insulation layer; and
  forming a seventh wiring layer, which is electrically connected to the electronic component by the sixth via wiring, on at least one of a lower surface of the first insulation layer and a lower surface of the first wiring layer.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the spirit and scope of the invention.

The invention claimed is:
1. A wiring substrate comprising:
  a first wiring layer;
  a first insulation layer stacked on the first wiring layer;

a plurality of insulation layers including a second insulation layer, which is stacked on an upper surface of the first insulation layer, and a third insulation layer, which is stacked on an upper surface of the second insulation layer;

a cavity that extends through the plurality of insulation layers and partially exposes the upper surface of the first insulation layer;

an electronic component mounted on the first insulation layer exposed in the cavity;

a fourth insulation layer that entirely covers an upper surface of an uppermost one of the plurality of insulation layers and covers the electronic component, wherein the cavity is filled with the fourth insulation layer;

a second wiring layer electrically connected to the first wiring layer, incorporated in the plurality of insulation layers, and covered by the uppermost one of the plurality of insulation layers, wherein the second wiring layer is formed on the upper surface of the second insulation layer;

a first via wiring formed by a single via wiring, wherein the first via wiring extends continuously through the uppermost one of the plurality of insulation layers and the fourth insulation layer from an upper surface of the fourth insulation layer to an upper surface of the second wiring layer; and a third wiring layer stacked on the upper surface of the fourth insulation layer and electrically connected to the second wiring layer by the first via wiring, wherein the upper surface of the uppermost one of the plurality of insulation layers is free from a wiring layer.

2. The wiring substrate according to claim 1, wherein
the plurality of insulation layers include the second insulation layer and the third insulation layer, and
the cavity extends through the second insulation layer and the third insulation layer in a thickness-wise direction,
the wiring substrate further comprising:
a second via wiring that extends through the first insulation layer;
a fourth wiring layer stacked on the upper surface of the first insulation layer and electrically connected to the first wiring layer by the second via wiring; and
a third via wiring that extends through the second insulation layer,
wherein the second wiring layer is electrically connected to the fourth wiring layer by the third via wiring, and
the third wiring layer is electrically connected to the second wiring layer by the first via wiring, the first via wiring extending through the third insulation layer and the fourth insulation layer.

3. The wiring substrate according to claim 1, wherein
the plurality of insulation layers include the second insulation layer and the third insulation layer, and
the cavity extends through the second insulation layer and the third insulation layer in a thickness-wise direction,
the wiring substrate further comprising:
a fourth via wiring that extends through the first insulation layer and the second insulation layer,
wherein the second wiring layer is electrically connected to the first wiring layer by the fourth via wiring, and
the third wiring layer is electrically connected to the second wiring layer by the first via wiring, the first via wiring extending through the third insulation layer and the fourth insulation layer.

4. The wiring substrate according to claim 1, wherein
the first wiring layer is a lowermost wiring layer, and
the first insulation layer covers an upper surface and a side surface of the first wiring layer and exposes a lower surface of the first wiring layer.

5. The wiring substrate according to claim 1, further comprising a fifth wiring layer directly stacked on a lower surface of the first wiring layer and directly connected to the first wiring layer.

6. The wiring substrate according to claim 1, further comprising a fifth via wiring with which a first through hole extending through the fourth insulation layer is filled, wherein the fifth via wiring is connected to the electronic component.

7. The wiring substrate according to claim 1, further comprising a sixth via wiring with which a second through hole extending through the first insulation layer is filled, wherein the sixth via wiring is connected to the electronic component.

8. The wiring substrate according to claim 1, further comprising:
a fifth via wiring with which a first through hole extending through the fourth insulation layer is filled;
a sixth wiring layer stacked on the upper surface of the fourth insulation layer and electrically connected to the electronic component by the fifth via wiring;
a sixth via wiring with which a second through hole extending through the first insulation layer is filled; and
a seventh wiring layer electrically connected to the electronic component by the sixth via wiring and stacked on at least one of a lower surface of the first insulation layer and a lower surface of the first wiring layer,
wherein the first through hole includes a first opening end located closer to the electronic component and a second opening end located closer to the upper surface of the fourth insulation layer, and the first opening end has a smaller diameter than the second opening end, and
the second through hole includes a third opening end located closer to the electronic component and a fourth opening end located closer to the lower surface of the first insulation layer, and the third opening end has a smaller diameter than the fourth opening end.

* * * * *